US012237175B2

(12) United States Patent
Nagabhirava et al.

(10) Patent No.: US 12,237,175 B2
(45) Date of Patent: Feb. 25, 2025

(54) POLYMERIZATION PROTECTIVE LINER FOR REACTIVE ION ETCH IN PATTERNING

(71) Applicants: Lam Research Corporation, Fremont, CA (US); International Business Machines Corporation, Armonk, NY (US)

(72) Inventors: Bhaskar Nagabhirava, Cohoes, NY (US); Phillip Friddle, Clifton Park, NY (US); Michael Goss, Holliston, MA (US); Yann Mignot, Slingerlands, NY (US); Dominik Metzler, Saratoga Springs, NY (US)

(73) Assignees: Lam Research Corporation, Fremont, CA (US); International Business Machines Corporation, Armonk, NY (US)

( * ) Notice: Subject to any disclaimer, the term of this patent is extended or adjusted under 35 U.S.C. 154(b) by 447 days.

(21) Appl. No.: 17/596,189

(22) PCT Filed: Jun. 3, 2020

(86) PCT No.: PCT/US2020/070118
§ 371 (c)(1),
(2) Date: Dec. 3, 2021

(87) PCT Pub. No.: WO2020/247977
PCT Pub. Date: Dec. 10, 2020

(65) Prior Publication Data
US 2022/0238349 A1 Jul. 28, 2022

Related U.S. Application Data

(60) Provisional application No. 62/857,190, filed on Jun. 4, 2019.

(51) Int. Cl.
*H01L 21/311* (2006.01)
*H01L 21/67* (2006.01)
*H01L 21/768* (2006.01)

(52) U.S. Cl.
CPC .......... *H01L 21/31144* (2013.01); *H01L 21/31116* (2013.01); *H01L 21/67069* (2013.01); *H01L 21/76802* (2013.01)

(58) Field of Classification Search
None
See application file for complete search history.

(56) References Cited

U.S. PATENT DOCUMENTS 4,158,717 A 6/1979 Nelson
4,419,809 A 12/1983 Riseman et al.
(Continued)

FOREIGN PATENT DOCUMENTS

CN 1732288 A 2/2006
CN 1841676 A 10/2006
(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.
(Continued)

*Primary Examiner* — Binh X Tran
(74) *Attorney, Agent, or Firm* — Weaver Austin Villeneuve & Sampson LLP

(57) ABSTRACT

Methods of patterning vias and trenches using a polymerization protective liner after forming a lower patterned mask layer used for etching trenches on a semiconductor substrate prior to forming an upper patterned mask layer used for etching vias are provided. Methods involve forming a polymerization protective liner either nonconformally or
(Continued)

conformally using silicon tetrachloride and methane polymerization. Polymerization protective liners may be sacrificial.

20 Claims, 15 Drawing Sheets

(56) References Cited

U.S. PATENT DOCUMENTS

| | | | |
|---|---|---|---|
| 4,500,563 A | 2/1985 | Ellenberger et al. |
| 4,575,921 A | 3/1986 | Bhagat |
| 4,869,781 A | 9/1989 | Euen et al. |
| 5,091,332 A | 2/1992 | Bohr et al. |
| 5,202,272 A | 4/1993 | Hsieh et al. |
| 5,230,929 A | 7/1993 | Caporiccio et al. |
| 5,314,724 A | 5/1994 | Tsukune et al. |
| 5,459,099 A | 10/1995 | Hsu |
| 5,496,608 A | 3/1996 | Matsuda et al. |
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,632,741 B1 | 10/2003 | Clevenger et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,482,247 B1 | 1/2009 | Papasouliotis et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,700,492 B2 | 4/2010 | Kikuchi |
| 7,713,592 B2 | 5/2010 | Nguyen et al. |
| 7,732,343 B2 | 6/2010 | Niroomand et al. |
| 7,758,920 B2 | 7/2010 | Hasebe et al. |
| 7,807,578 B2 | 10/2010 | Bencher et al. |
| 7,825,039 B2 | 11/2010 | Takahashi et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,105,901 B2 | 1/2012 | Cheng et al. |
| 8,119,544 B2 | 2/2012 | Hasebe et al. |
| 8,129,555 B2 | 3/2012 | Cheng et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,592,328 B2 | 11/2013 | Hausmann et al. |
| 8,623,770 B1 | 1/2014 | Gao et al. |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,846,484 B2 | 9/2014 | Lee et al. |
| 8,936,977 B2 | 1/2015 | Hoentschel et al. |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,355,839 B2 | 5/2016 | Swaminathan et al. |
| 9,390,909 B2 | 7/2016 | Pasquale et al. |
| 9,406,693 B1 | 8/2016 | Pang et al. |
| 9,443,731 B1 | 9/2016 | O'Meara et al. |
| 9,472,506 B2 | 10/2016 | Conklin et al. |
| 9,502,234 B2 | 11/2016 | Xiao et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,611,544 B2 | 4/2017 | Lavoie et al. |
| 9,670,579 B2 | 6/2017 | Hausmann et al. |
| 9,721,784 B2 | 8/2017 | Behera et al. |
| 9,865,815 B2 | 1/2018 | Hausmann |
| 9,875,891 B2 | 1/2018 | Henri et al. |
| 9,892,933 B2 | 2/2018 | Peng et al. |
| 9,905,415 B2 | 2/2018 | Chandra et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann |
| 10,269,559 B2 | 4/2019 | Abel et al. |
| 10,454,029 B2 | 10/2019 | McKerrow et al. |
| 10,629,435 B2 | 4/2020 | Swaminathan et al. |
| 10,658,172 B2 | 5/2020 | Abel et al. |
| 10,804,099 B2 | 10/2020 | Henri et al. |
| 10,832,908 B2 | 11/2020 | LaVoie |
| 2002/0001889 A1 | 1/2002 | Kim et al. |
| 2002/0001929 A1 | 1/2002 | Biberger et al. |
| 2003/0143841 A1 | 7/2003 | Yang et al. |
| 2004/0043570 A1 | 3/2004 | Fujisaki et al. |
| 2005/0025885 A1 | 2/2005 | McSwiney et al. |
| 2005/0042865 A1 | 2/2005 | Cabral, Jr. et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0123690 A1 | 6/2005 | Derderian et al. |
| 2005/0142878 A1 | 6/2005 | Jung |
| 2005/0158983 A1 | 7/2005 | Hoshi et al. |
| 2005/0159017 A1 | 7/2005 | Kim et al. |
| 2005/0170104 A1 | 8/2005 | Jung et al. |

(56) References Cited

U.S. PATENT DOCUMENTS

| | | |
|---|---|---|
| 2005/0196977 A1 | 9/2005 | Saito et al. |
| 2005/0205519 A1* | 9/2005 | Kim ............... H01L 21/76811 |
| | | 216/72 |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2005/0287815 A1* | 12/2005 | Lai ................... H01L 21/30655 |
| | | 156/345.1 |
| 2006/0003557 A1 | 1/2006 | Cabral et al. |
| 2006/0008656 A1 | 1/2006 | Veerasamy |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0199357 A1 | 9/2006 | Wan et al. |
| 2006/0263699 A1 | 11/2006 | Abatchev et al. |
| 2006/0273456 A1 | 12/2006 | Sant et al. |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0099431 A1 | 5/2007 | Li |
| 2007/0137572 A1 | 6/2007 | Matsuura et al. |
| 2007/0148968 A1 | 6/2007 | Kwon et al. |
| 2007/0167028 A1 | 7/2007 | Chou et al. |
| 2007/0190782 A1 | 8/2007 | Park |
| 2007/0212850 A1 | 9/2007 | Ingle et al. |
| 2007/0218661 A1 | 9/2007 | Shroff et al. |
| 2007/0238299 A1 | 10/2007 | Niroomand et al. |
| 2007/0238316 A1 | 10/2007 | Ohashi |
| 2007/0251444 A1 | 11/2007 | Gros-Jean et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0176375 A1* | 7/2009 | Benson ................. C09K 13/00 |
| | | 438/719 |
| 2009/0191722 A1 | 7/2009 | Hasebe et al. |
| 2009/0286381 A1 | 11/2009 | Van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0159673 A1 | 6/2011 | Hanawa et al. |
| 2011/0176967 A1 | 7/2011 | Okuda et al. |
| 2011/0183528 A1 | 7/2011 | Wang et al. |
| 2011/0244142 A1 | 10/2011 | Cheng et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0011889 A1 | 1/2012 | Bogdahn et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1 | 7/2012 | Hwang |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0210236 A1 | 8/2013 | Ogihara et al. |
| 2013/0252437 A1 | 9/2013 | Sano et al. |
| 2013/0327636 A1 | 12/2013 | Majetich et al. |
| 2013/0344391 A1 | 12/2013 | Clark |
| 2014/0023794 A1 | 1/2014 | Mahajani et al. |
| 2014/0110373 A1* | 4/2014 | Nishimura ........ H01L 21/31122 |
| | | 216/41 |
| 2014/0113455 A1 | 4/2014 | Reimer et al. |
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273490 A1* | 9/2014 | Mao ................... H01L 21/0335 |
| | | 438/717 |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0132965 A1 | 5/2015 | Devilliers et al. |
| 2015/0137061 A1 | 5/2015 | Donghi et al. |
| 2015/0155198 A1 | 6/2015 | Tsai et al. |
| 2015/0162416 A1 | 6/2015 | Chang et al. |
| 2015/0200110 A1 | 7/2015 | Li et al. |
| 2015/0243708 A1 | 8/2015 | Ravasio |
| 2015/0249153 A1 | 9/2015 | Morin et al. |
| 2015/0251917 A1 | 9/2015 | Hong et al. |
| 2015/0259791 A1 | 9/2015 | Hausmann et al. |
| 2015/0332929 A1 | 11/2015 | Hisamatsu et al. |
| 2016/0020092 A1 | 1/2016 | Kang et al. |
| 2016/0042950 A1 | 2/2016 | Dai et al. |
| 2016/0046501 A1 | 2/2016 | Kverel et al. |
| 2016/0049307 A1 | 2/2016 | Chen |
| 2016/0064224 A1 | 3/2016 | Hung et al. |

(56) References Cited

U.S. PATENT DOCUMENTS

| | | | |
|---|---|---|---|
| 2016/0079054 A1 | 3/2016 | Chen et al. |
| 2016/0093484 A1 | 3/2016 | Marsh |
| 2016/0099143 A1 | 4/2016 | Yan et al. |
| 2016/0109804 A1 | 4/2016 | Huli |
| 2016/0111297 A1 | 4/2016 | Chen et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0172194 A1 | 6/2016 | Kunnen et al. |
| 2016/0203998 A1 | 7/2016 | Tobana et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0336178 A1 | 11/2016 | Swaminathan et al. |
| 2016/0336187 A1 | 11/2016 | Liou et al. |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092496 A1 | 3/2017 | Devilliers |
| 2017/0092857 A1 | 3/2017 | Hausmann |
| 2017/0110550 A1 | 4/2017 | Tsai et al. |
| 2017/0117134 A1 | 4/2017 | Henri et al. |
| 2017/0148637 A1 | 5/2017 | Devilliers |
| 2017/0170015 A1 | 6/2017 | Kim et al. |
| 2017/0170026 A1 | 6/2017 | Hudson et al. |
| 2017/0323785 A1 | 11/2017 | Singhal et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala et al. |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0223429 A1 | 8/2018 | Fukazawa et al. |
| 2019/0080903 A1 | 3/2019 | Abel et al. |
| 2019/0206677 A1 | 7/2019 | Abel et al. |
| 2021/0074583 A1* | 3/2021 | You ..................... H01L 23/5226 |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 102906305 A | 1/2013 |
| CN | 103225071 A | 7/2013 |
| CN | 103515197 A | 1/2014 |
| CN | 103632955 A | 3/2014 |
| CN | 104046955 A | 9/2014 |
| CN | 104752199 A | 7/2015 |
| CN | 105789027 A | 7/2016 |
| CN | 105917445 A | 8/2016 |
| CN | 105977141 A | 9/2016 |
| EP | 0277766 A2 | 8/1988 |
| EP | 2278046 A1 | 1/2011 |
| GB | 1181559 A | 2/1970 |
| JP | 2005011904 A | 1/2005 |
| JP | 2005163084 A | 6/2005 |
| JP | 2005210076 A | 8/2005 |
| JP | 2006060091 A | 3/2006 |
| JP | 2006080359 A | 3/2006 |
| JP | 2006514783 A | 5/2006 |
| JP | 2007281181 A | 10/2007 |
| JP | 2007529905 A | 10/2007 |
| JP | 2008517479 A | 5/2008 |
| JP | 2008306093 A | 12/2008 |
| JP | 2009135478 A | 6/2009 |
| JP | 2009170823 A | 7/2009 |
| JP | 2010010497 A | 1/2010 |
| JP | 2010527138 A | 8/2010 |
| JP | 2010232214 A | 10/2010 |
| JP | 2010239103 A | 10/2010 |
| JP | 2010283388 A | 12/2010 |
| JP | 2011192776 A | 9/2011 |
| JP | 2012084707 A | 4/2012 |
| JP | 2012142574 A | 7/2012 |
| JP | 2012169408 A | 9/2012 |
| JP | 2013153164 A | 8/2013 |
| JP | 2013182951 A | 9/2013 |
| JP | 2013225655 A | 10/2013 |
| JP | 2014038968 A | 2/2014 |
| JP | 2014179607 A | 9/2014 |
| JP | 2014532304 A | 12/2014 |
| JP | 2015521799 A | 7/2015 |
| JP | 2015220277 A | 12/2015 |
| KR | 20010075177 A | 8/2001 |
| KR | 100613390 B1 | 8/2006 |
| KR | 20060127209 A | 12/2006 |
| KR | 20090080019 A | 7/2009 |
| KR | 20090131821 A | 12/2009 |
| KR | 20100128863 A | 12/2010 |
| KR | 101057691 B1 | 8/2011 |
| KR | 20150021584 A | 3/2015 |
| KR | 20150025224 A | 3/2015 |
| KR | 20150053253 A | 5/2015 |
| KR | 20150103642 A | 9/2015 |
| KR | 20150131967 A | 11/2015 |
| KR | 20160033057 A | 3/2016 |
| TW | 483103 B | 4/2002 |
| TW | 201033739 A | 9/2010 |
| TW | 201439105 A | 10/2014 |
| TW | 201606855 A | 2/2016 |
| WO | WO-2005091974 A2 | 10/2005 |
| WO | WO-2006018441 A1 | 2/2006 |
| WO | WO-2006026350 A2 | 3/2006 |
| WO | WO-2011130397 A2 | 10/2011 |
| WO | WO-2012061593 A2 | 5/2012 |
| WO | WO-2013043330 A1 | 3/2013 |
| WO | WO-2013066667 A1 | 5/2013 |
| WO | WO-2013137115 A1 | 9/2013 |
| WO | WO-2013192323 A1 | 12/2013 |
| WO | WO-2014030393 A1 | 2/2014 |

OTHER PUBLICATIONS

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Chinese First Office Action dated Apr. 12, 2021 issued in Application No. CN 201711112653.9.

Chinese First Office Action dated Jul. 31, 2020 issued in Application No. CN 201710636255.0.

Chinese First Office Action dated Jun. 23, 2020 issued in Application No. CN 201811075877.1.

Chinese First Office Action dated Mar. 30, 2018 issued in Application No. CN 201610206201.6.

Chinese First Office Action dated May 19, 2016 issued in Application No. CN 201310021460.8.

Chinese First Office Action dated Nov. 13, 2020 issued in Application No. CN 201710772400.8.

Chinese First Office Action dated Nov. 8, 2017 issued in Application No. CN 201510615853.0.

Chinese Fourt Office Action dated May 16, 2018 issued in Application No. CN 201310021460.8.

Chinese Notification of Reexamination dated Apr. 17, 2020 issued in Application No. CN 201310021460.8.

Chinese Second Office Action dated Apr. 13, 2017 issued in Application No. CN 201310021460.8.

(56) References Cited

OTHER PUBLICATIONS

Chinese Second Office Action dated Jan. 24, 2019 issued in Application No. CN 201610206201.6.
Chinese Second Office Action dated Mar. 15, 2021 issued in Application No. CN 201811075877.1.
Chinese Third Office Action dated Oct. 17, 2017 issued in Application No. CN 201310021460.8.
CN Office Action dated Nov. 19, 2021, in application No. CN201711112653 with English translation.
CN Office Action dated Sep. 2, 2021, in application No. CN201811075877.1 with English translation.
European Examination Report dated Dec. 11, 2017 issued in Application No. EP 13 15 2046.
European Extended Search Report dated Apr. 14, 2014 issued in Application No. EP13152046.2.
Huang et al. (2017) "Design of efficient mono-aminosilane precursors for atomic layer deposition of SiO2 thin films," Royal Society of Chemistry Adv. 2017, 7:22672-22678.
International Preliminary Report on Patentability dated Dec. 16, 2021, for International Application No. PCT/US2020/070118.
International Preliminary Report on Patentability dated Feb. 17, 2022 in PCT Application No. PCT/US2020/043459.
International Preliminary Report on Patentability dated Mar. 26, 2020 issued in Application No. PCT/US2018/050049.
International Preliminary Report on Patentability dated May 23, 2019 issued in Application No. PCT/US17/60692.
International Preliminary Report on Patentability dated May 23, 2019 issued in Application No. PCT/US2017/060240.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated Nov. 11, 2020 issued in Application No. PCT/US2020/043459.
International Search Report and Written Opinion dated Sep. 18, 2020, issued in PCT/US2020/070118.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.
Japanese Notice of Allowance Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jan. 12, 2022 in Application No. KR1020150163065 with English translation.
KR Office Action dated Jan. 26, 2022, in Application No. 10-2019-7016749 with English translation.
KR Office Action dated Mar. 4, 2022, in Application No. 10-2019-7017087 with English Translation.
KR Office Action dated Nov. 30, 2021 in Application No. KR1020197017087 with English Translation.
KR Office Action dated Sep. 27, 2021, in application No. KR20210086044 with English translation.
KR Office Action dated Sep. 29, 2021, in application No. KR1020170109223 with English translation.
Kunnen et al., (2015) "A way to integrate multiple block layers for middle of line contact patterning," Proc. of SPIE, 9428:94280W1-8 [Downloaded on Jun. 27, 2017 from http://proceedings.spiedigitallibrary.org].
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP® 80 Range," Oxford Instruments (2010), 8 pages.
Singapore Notice of Eligibility for Grant and Supplemental Examination Report dated Jan. 20, 2020 issued in Application No. SG 10201507848X.
Taiwan Examination Report dated Mar. 29, 2017 issued in Application No. TW 102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW 104138370.
Taiwanese First Office Action dated Mar. 25, 2020 issued in Application No. TW 105130541.
Taiwanese Notice of Allowance dated Feb. 17, 2019 issued in Application No. TW 104138370.
US Advisory Action dated May 20, 2019 issued in U.S. Appl. No. 15/349,746.
U.S. Appl. No. 16/852,261, inventors Abel et al., filed Apr. 17, 2020.
U.S. Appl. No. 17/632,074, inventors Gupta et al., filed Feb. 1, 2022.
US Final Office Action dated Apr. 20, 2018 issued in U.S. Appl. No. 15/349,753.
US Final Office Action dated Apr. 25, 2013 issued in U.S. Appl. No. 13/084,305.
US Final Office Action dated Apr. 9, 2018 issued in U.S. Appl. No. 15/279,312.
US Final Office Action dated Dec. 21, 2018 issued in U.S. Appl. No. 15/349,746.
US Final Office Action dated Feb. 5, 2020 issued in U.S. Appl. No. 15/349,746.
US Final Office Action dated Jan. 18, 2018 issued in U.S. Appl. No. 15/349,746.

(56) References Cited

OTHER PUBLICATIONS

US Final Office Action dated Jan. 2, 2018 issued in U.S. Appl. No. 15/351,221.
US Final Office Action dated Jan. 21, 2020 issued in U.S. Appl. No. 15/847,744.
US Final Office Action dated Nov. 14, 2014 issued in U.S. Appl. No. 14/065,334.
US Final Office Action dated Oct. 19, 2017 issued in U.S. Appl. No. 15/279,314.
US Notice of Allowance dated Apr. 25, 2018 issued in U.S. Appl. No. 15/253,546.
US Notice of Allowance dated Aug. 18, 2015 issued in U.S. Appl. No. 14/494,914.
US Notice of Allowance dated Dec. 11, 2019 issued in U.S. Appl. No. 15/279,312.
US Notice of Allowance dated Dec. 5, 2018 issued in U.S. Appl. No. 15/703,917.
US Notice of Allowance dated Feb. 1, 2016 issued in U.S. Appl. No. 14/552,245.
US Notice of Allowance dated Feb. 17, 2015 issued in U.S. Appl. No. 14/065,334.
US Notice of Allowance dated Feb. 8, 2017 issued in U.S. Appl. No. 14/713,639.
US Notice of Allowance dated Jan. 15, 2020 issued in U.S. Appl. No. 16/294,783.
US Notice of Allowance dated Jul. 1, 2020 issued in U.S. Appl. No. 15/349,746.
US Notice of Allowance dated Jul. 15, 2016 issued in U.S. Appl. No. 14/678,736.
US Notice of Allowance dated Jul. 16, 2018 issued in U.S. Appl. No. 15/351,221.
US Notice of Allowance dated Jul. 26, 2013, issued U.S. Appl. No. 13/414,619.
US Notice of Allowance dated Jul. 26, 2018 issued in U.S. Appl. No. 15/829,702.
US Notice of Allowance dated Jun. 17, 2019 issued in U.S. Appl. No. 15/349,753.
US Notice of Allowance dated May 28, 2020 issued in U.S. Appl. No. 15/847,744.
US Notice of Allowance dated Oct. 26, 2016 issued in U.S. Appl. No. 14/552,245.
US Notice of Allowance dated Sep. 1, 2017 issued in U.S. Appl. No. 15/272,222.
US Notice of Allowance dated Sep. 19, 2016 issued in U.S. Appl. No. 14/935,317.
US Notice of Allowance dated Sep. 26, 2016 issued in U.S. Appl. No. 14/552,011.
US Notice of Allowance dated Sep. 28, 2017 issued in U.S. Appl. No. 15/399,637.
US Office Action dated Apr. 11, 2014 issued in U.S. Appl. No. 14/065,334.
US Office Action dated Apr. 18, 2016 issued in U.S. Appl. No. 14/935,317.
US Office Action dated Apr. 18, 2019 issued in U.S. Appl. No. 15/279,312.
US Office Action dated Apr. 7, 2017 issued in U.S. Appl. No. 15/279,314.
US Office Action dated Jul. 14, 2017 issued in U.S. Appl. No. 15/349,746.
US Office Action dated Jul. 18, 2018 issued in U.S. Appl. No. 15/703,917.
US Office Action dated Jul. 30, 2019 issued in U.S. Appl. No. 15/847,744.
US Office Action dated Jul. 5, 2017 issued in U.S. Appl. No. 15/351,221.
US Office Action dated Jun. 14, 2019 issued in U.S. Appl. No. 15/349,746.
US Office Action dated Jun. 29, 2017 issued in U.S. Appl. No. 15/279,312.
US Office Action dated Jun. 29, 2018 issued in U.S. Appl. No. 15/349,746.
US Office Action dated Jun. 7, 2013 issued U.S. Appl. No. 13/414,619.
US Office Action dated May 19, 2017 issued in U.S. Appl. No. 15/272,222.
US Office Action dated May 24, 2016 issued in U.S. Appl. No. 14/552,245.
US Office Action dated May 25, 2016 issued in U.S. Appl. No. 14/552,011.
US Office Action dated Oct. 1, 2015 issued in U.S. Appl. No. 14/552,245.
US Office Action dated Oct. 23, 2017 issued in U.S. Appl. No. 15/349,753.
US Office Action dated Oct. 6, 2017 issued in U.S. Appl. No. 15/253,546.
US Office Action dated Sep. 14, 2012 issued in U.S. Appl. No. 13/084,305.
US Office Action dated Sep. 28, 2018 issued in U.S. Appl. No. 15/349,753.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
KR Office Action dated Aug. 25, 2024 in KR Application No. 10-2022-7000047, with English Translation.

* cited by examiner

POLYMERIZATION PROTECTIVE LINER FOR REACTIVE ION ETCH IN PATTERNING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Many semiconductor fabrication processes involve patterning schemes that include etching vias and trenches. However, as devices shrink and selected materials change, etching vias and trenches introduces challenges that include patterning loading and undercut of materials.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for processing semiconductor substrates. One aspect involves a method including: providing a semiconductor substrate to a chamber, the semiconductor substrate having a target layer having a thickness t and a metallization layer underlying the target layer with at least one region including metal; forming a lower patterned mask layer over the target layer by etching a lower mask layer; and forming a polymerization protective liner over the lower patterned mask layer without breaking vacuum. Some embodiments of this aspect include corresponding computer systems, apparatus, and computer programs recorded on one or more computer storage devices, each configured to perform the actions of the methods.

Implementations may include one or more of the following features. In some embodiments, the method further includes forming an upper mask layer over the polymerization protective liner; patterning the semiconductor substrate using the upper mask layer to form at least one via aligning with the at least one region including metal; and after patterning the semiconductor substrate using the upper mask layer, patterning the target layer using reactive ion etch.

In some embodiments, the polymerization protective liner is deposited nonconformally and reduces reactive ion etch lag by at least 5-10%. In some embodiments, the lower patterned mask layer includes one or more corners exposed during patterning of the semiconductor substrate using the upper mask layer to form the at least one via. In some embodiments, the at least one via has a critical dimension of between about 10 nm and about 30 nm.

In some embodiments, the upper mask layer is formed by extreme ultraviolet lithography. In various embodiments, the lower patterned mask layer is formed by extreme ultraviolet lithography. In some embodiments, the polymerization protective liner is a sacrificial film.

The method may include forming of the polymerization protective liner and patterning of the lower patterned mask layer performed in the same chamber. In some embodiments, the thickness of the polymerization protective liner in features of different sizes is etched at the same rate during reactive ion etch. In some embodiments, less than 5A of the lower patterned mask layer is etched during the patterning of the semiconductor substrate using the upper mask layer as a result of the polymerization protective liner on the lower patterned mask layer.

In some embodiments, the polymerization protective liner is deposited using silicon tetrachloride and methane. In some embodiments, the lower patterned mask layer includes material selected from the group including titanium nitride, titanium oxide, and tungsten-containing materials.

In some embodiments, the lower patterned mask layer includes negative features having a critical dimension between about 10 nm and about 30 nm. In some embodiments, the lower patterned mask layer includes spaced apart positive features with wide and narrow negative features between positive features; and where thickness of the polymerization protective liner deposited at bottoms of wide negative features is greater than thickness of the polymerization protective liner deposited at bottoms of narrow negative features. In some embodiments, the metallization layer includes copper. In some embodiments, patterning the semiconductor substrate using the upper patterned mask layer results in less than 2 nm of undercut in the target layer. Implementations of the described techniques may include hardware, a method or process, or computer software on a computer-accessible medium.

One aspect involves a method including: providing a semiconductor substrate having a lower patterned mask layer over a target layer having a thickness t and a metallization layer underlying the target layer with at least one region including metal; forming a polymerization protective liner over the lower patterned mask layer; forming an upper mask layer over the polymerization protective liner; patterning the semiconductor substrate using the upper mask layer to form at least one via aligning with the at least one region including metal; and after patterning the semiconductor substrate using the upper mask layer, patterning the target layer using reactive ion etch. Some embodiments of this aspect include corresponding computer systems, apparatus, and computer programs recorded on one or more computer storage devices, each configured to perform the actions of the methods.

Implementations may include one or more of the following features. In some embodiments, forming of the polymerization protective liner and patterning of the semiconductor substrate using either the lower patterned mask layer or the upper mask layer are performed without breaking vacuum. In some embodiments, the semiconductor substrate further includes a second region of the target layer with no lower patterned mask layer overlying it. In some embodiments, patterning the target layer etches the second region and the target layer to the same thickness remaining on the semiconductor substrate. In some embodiments, the difference in thickness of the second region and the target layer not in the second region after patterning the target layer is less than 5 nm. In some embodiments, the target layer is patterned to preserve a thickness of the target layer less than t and greater than 0 on regions of the target layer not underlying the lower patterned mask layer. In some embodiments, the target layer includes ultra-low k dielectric material. Implementations of the described techniques may include hardware, a method or process, or computer software on a computer-accessible medium.

One aspect involves an apparatus for processing a semiconductor substrate, the apparatus including: one or more process chambers, where at least one process chamber includes a pedestal for holding the semiconductor substrate; a plasma generator; one or more gas inlets into the process chambers and associated flow-control hardware; and a controller having at least one processor and a memory, where the at least one processor and the memory are communicatively connected with one another, the at least one processor is at least operatively connected with the flow-control hardware, and the memory stores computer-executable instructions for controlling the at least one processor to at least control the flow-control hardware by: (i) causing a lower mask layer on the semiconductor substrate to be etched to form a patterned lower mask layer; and (ii) after causing the lower mask layer to be etched, causing introduction of silicon tetrachloride and methane to form a polymerization protective liner over the patterned lower mask layer. Some embodiments of this aspect include corresponding computer systems, apparatus, and computer programs recorded on one or more computer storage devices, each configured to perform the actions of the methods.

Implementations may include one or more of the following features. In some embodiments, the plasma generator is inductively coupled. Implementations of the described techniques may include hardware, a method or process, or computer software on a computer-accessible medium. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication involves various patterning schemes for forming a variety of structures. Some patterning processes involve fabricating vias for later metallization operations, and processes may involve maintaining the integrity of the via profile to form high performing structures.

Such structures are formed by exposing materials to particular etching chemistries using masking and selectivity to form the desired structures. However, the combination of the exposed material and etching chemistry can pose challenges when the some exposed material is susceptible to tapering or undercut when exposed to etch chemistries used to etch other regions of a substrate. Example techniques for reducing this effect include modifying either the materials that are susceptible to etch or the material to be etched, or changing the etch chemistry used during etch.

Some patterning processes involve reactive ion etching (RIE) of dielectric material on a patterned substrate having different sized negative features. However, an effect referred to as "RIE lag" may occur—that is, etching in one feature is faster, or slower, than etching in another feature due to the size of the feature. This is also referred to as "pattern loading."

Some patterning processes can also affect critical dimension of features etched therein, which may be due to angled bombardment of ions that cause undercut during etch and thereby etch in areas that are not desired.

An example patterning scheme is provided in FIGS. 1-6. These figures show an example of a problem that can occur during a patterning process. As described below, these figures show a patterning scheme involving a lower and upper mask to etch vias and trenches.

Figure 1:
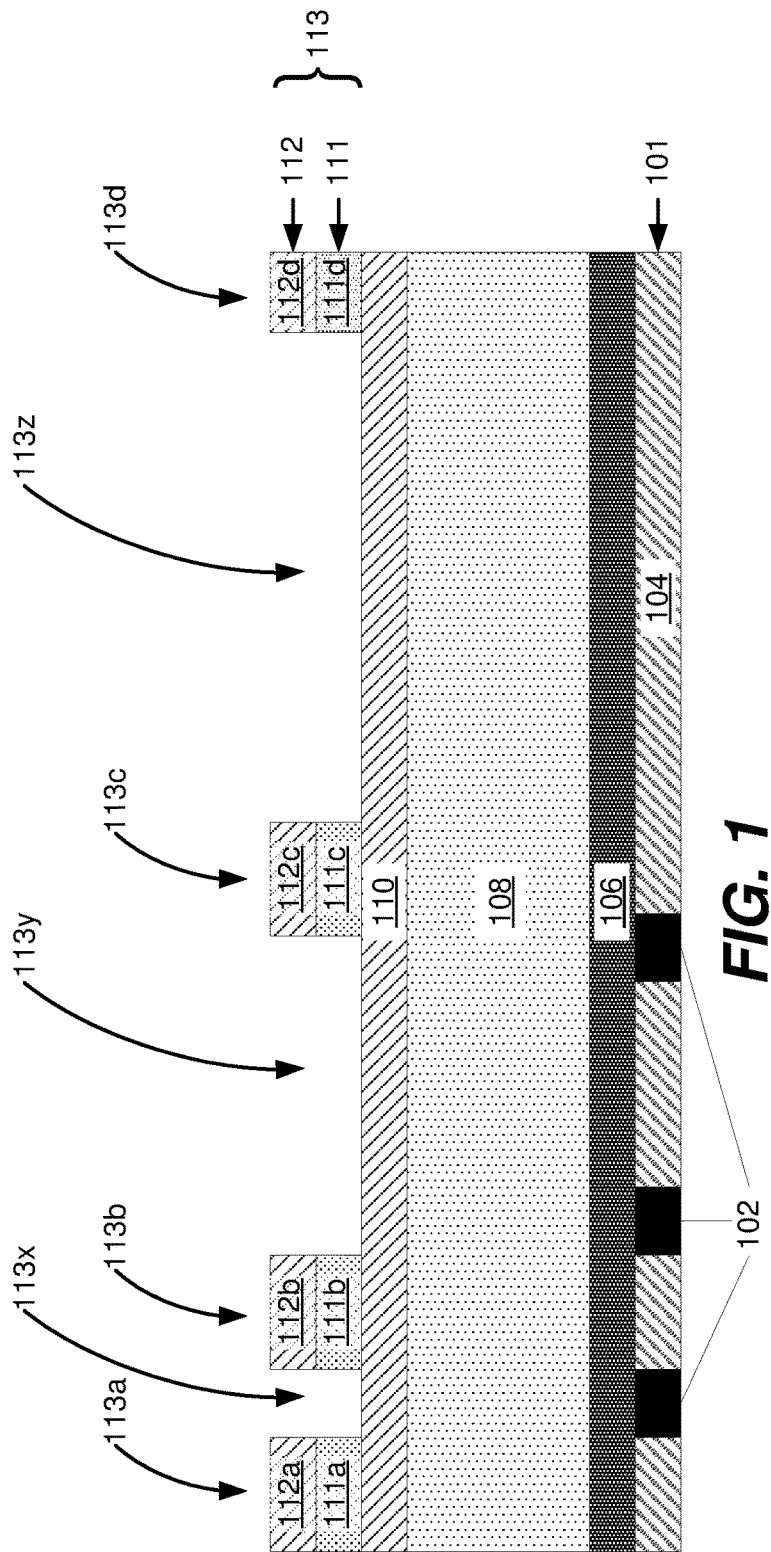
FIGS. 1-6 are schematic illustrations of example drawings of substrates in a patterning scheme.

FIG. 1 shows an example substrate with various layers. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as pillars, poles, trenches, via or contact holes, which may be characterized by one or more of narrow and/or re-entrant openings, constrictions within the feature, and high aspect ratios. The feature(s) may be formed in one or more of the above described layers. One example of a feature is a pillar or pole in a semiconductor substrate or a layer on the substrate. Another example is a trench in a substrate or layer.

It will be understood that additional layers not shown may also be present on the substrate. The substrate includes a first layer 101 which includes metal contacts 102 and dielectric material 104, such that dielectric material 104 is between the metal contacts 102 and thicknesses of the metal contacts 102 and dielectric material 104 are the same and top surfaces of metal contacts 102 and dielectric material 104 are flush. In some embodiments, metal contacts 102 include copper. A first etch stop layer 106 is depicted as being directly on top of the first layer 101. On top of the first etch stop layer 106 is an ultra-low k dielectric layer 108. The k value of the ultra-low k dielectric layer 108 may be between about 2 and about 2.7. The ultra-low k dielectric layer 108 is between about 40 nm and about 100 nm thick and is used as material for a sidewall of a future via to the metal contacts 102. "Future via" used herein refers to a via that will be etched on the substrate following patterning operations. In various embodiments, a future via is selected to align over one of the metal contacts 102.

On top of the ultra-low k dielectric layer 108 is a second etch stop layer 110. The second etch stop layer 110 may be silicon nitride material or silicon oxide material or both. In some embodiments, the second etch stop layer 110 is deposited using tetraethyl orthosilicate (TEOS). In various embodiments, the second etch stop layer 110 is a blanket layer having a thickness between about SA and about 20 Å. In this example, a lower patterned mask 113 is directly on top of the second etch stop layer 110. This lower patterned mask 113, will be referred to herein as the "lower" mask, in reference to the location of the mask relative to a later, "upper" mask described below.

The lower patterned mask 113 includes both a titanium nitride hard mask layer 111, as well as a TEOS layer 112, which may be silicon oxide used to protect the titanium nitride hard mask layer 111 during etch. The lower patterned mask 113 may have a feature height of about 20 nm to about 50 nm, or about 50 nm, such that the height includes both titanium nitride hard mask layer 111 and TEOS layer 112. The substrate provided in FIG. 1 may be a substrate that was previously exposed to etching chemistry to "open" the titanium nitride hard mask layer 111 and thereby pattern it.

Patterning results in forming the lower patterned mask 113, which as described herein, includes two materials (that is, each lower mask positive features 113a, 113b, 113c, and 113d is a stack of two materials—the TEOS material and titanium nitride material). It will be understood that, in some cases, a lower patterned mask 113 may include only one material or more than two materials. First lower mask positive feature 113a includes first titanium nitride hard mask 111a and first TEOS material 112a; second lower mask positive feature 113b includes second titanium nitride hard mask 111b and second TEOS material 112b; third lower mask positive feature 113c includes third titanium nitride hard mask 111c and third TEOS material 112c; and fourth lower mask positive feature 113d includes fourth titanium nitride hard mask 111d and fourth TEOS material 112d.

Between lower mask positive features are lower mask negative features 113x, 113y, and 113z. Lower mask negative feature 113z may have a critical dimension between about 100 nm and about 1 μm. Although four positive features and three negative features are depicted in this example, it will be understood that a substrate may include any number of positive and negative features. Each positive feature includes a particular thickness of titanium nitride hard mask layer 111 and TEOS layer 112, and sidewalls of the feature are such that the surface of titanium nitride hard mask layer 111 and TEOS layer 112 are flush. In some embodiments, the width of each positive feature may be the same. In some embodiments, the widths of the positive features are different.

First lower mask negative feature 113x is the space between the first lower mask positive feature 113a and second lower mask positive feature 113b. Second lower mask negative feature 113y is the space between the second lower mask positive feature 113b and third lower mask positive feature 113c. Third lower mask negative feature 113z is the space between the third lower mask positive feature 113c and fourth lower mask positive feature 113d. Additionally, the negative features defined by the spaces between the four positive features in FIG. 1 have different sizes. The space between positive features may also be different; that is they may not be equally spaced on the substrate and thus first lower mask negative feature 113x, second lower mask negative feature 113y, and third lower mask negative feature 113z may have different critical dimensions. For example, first lower mask negative feature 113x has an aspect ratio of about 1:1, and second lower mask negative feature 113y has an aspect ratio of about 1:3, and third lower mask negative feature 113z has an aspect ratio of about 1:10. While the drawing shows three different aspect ratios, it will be understood that any suitable number of aspect ratios can be present. Likewise, positive features may also have different aspect ratios.

The distance between positive features, and/or the aspect ratio of negative features between the positive features, may vary over the surface of the substrate. An example range of distances between positive features is between about 10 nm and about 30 nm or between about 20 nm and about 30 nm. The pattern formed by the lower patterned mask 113 is used in part to form later formed vias.

Figure 2:
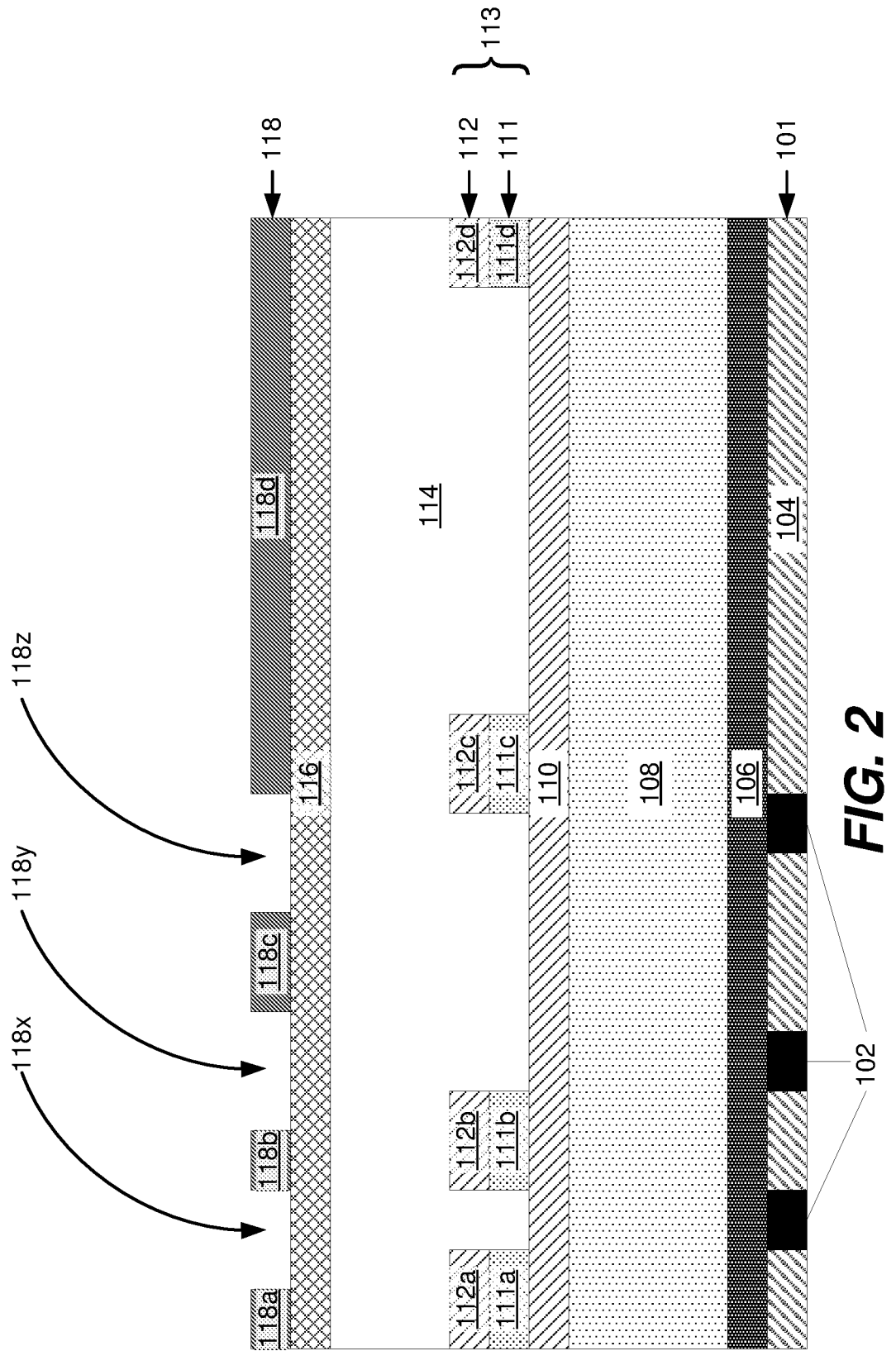

FIG. 2 shows an example schematic illustration of a substrate after a spin-on carbon layer is deposited and an upper mask is formed. Like FIG. 1, FIG. 2 includes the first layer 101 including metal contacts 102 and dielectric material 104; first etch stop layer 106; ultra-low k dielectric layer 108; second etch stop layer 110; titanium nitride hard mask layer 111; and TEOS layer 112. A spin-on carbon layer 114 is formed over the patterned substrate, filling the first lower mask negative feature 113x, second lower mask negative feature 113y, and third lower mask negative feature 113z of the lower patterned mask 113 depicted in FIG. 1. A third etch stop layer 116 is deposited over the spin-on carbon layer 114 (which also may be referred to as an organic polymerizing layer), and carbon-containing photoresist material is deposited and patterned to form the upper patterned mask 118. The third etch stop layer 116 may be an anti-reflective layer.

The pattern of the upper patterned mask 118 is different from that of the lower patterned mask 113 such that the upper patterned mask 118 can be used to form trenches while the lower patterned mask 113 can be used to form vias as desired. In this example, the upper patterned mask 118 includes four upper patterned mask positive features 118a, 118b, 118c, and 118d, spaced apart with three upper patterned mask negative features 118x, 118y, 118z between them such that first upper patterned mask negative feature 118x of the upper patterned mask 118 overlaps partially with the now filled first lower mask negative feature 113x of the lower patterned mask 113; second upper patterned mask negative feature 118y and third upper patterned mask negative feature 118z in the upper patterned mask 118 overlap with the second lower patterned mask negative feature 113y of the lower patterned mask 113, and the third lower mask negative feature 113z of the lower patterned mask 113 does not overlap with any negative feature (and is thus directly under a positive feature) of the upper patterned mask 118.

Figure 3:
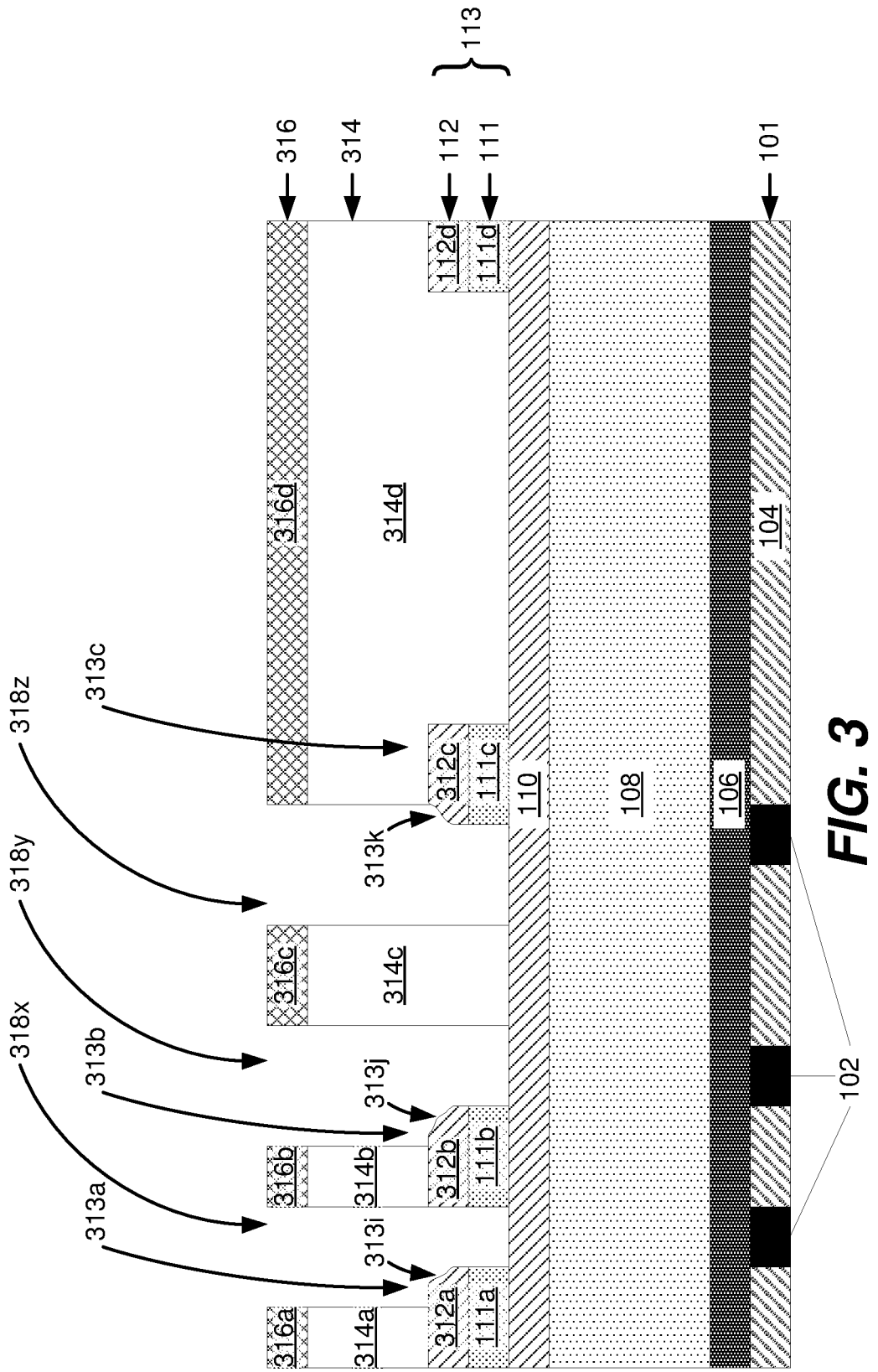

FIG. 3 shows an example of a substrate where corners may be etched during etching of the spin-on carbon layer 114. During this operation, the substrate may be exposed to a fluorine-containing plasma to etch the third etch stop layer 116. Additionally, the substrate may be further exposed to a non-fluorine-containing gas including nitrogen, hydrogen, oxygen, carbon monoxide, or combinations thereof, to pattern the spin-on carbon layer 114.

As shown, in FIG. 3, the upper patterned mask 118 is used to etch the spin-on carbon layer 114 and form patterned spin-on carbon layer 314 such that the pattern of upper patterned mask 118 is transferred to the spin-on carbon layer 114. During this operation, the third etch stop layer 116 is patterned to form patterned third etch stop layer 316, which includes first patterned third etch stop layer 316a, second patterned third etch stop layer 316b, third patterned third etch stop layer 316c, and fourth patterned third etch stop layer 316d. Etching is performed to the second etch stop layer 110.

Etching species travel into upper patterned mask negative features 118x, 118y, and 118z as shown in FIG. 2 to form first via 318x, second via 318y, and third via 318z, each of which align with one of each of the metal contacts 102. During etch, first degraded corner 313i, second degraded corner 313j, and third degraded corner 313j of first TEOS material 312a, second TEOS material 312b, and third TEOS material 313c, respectively, of the lower patterned mask 113 are exposed to the etching thereby resulting in degraded lower patterned mask positive features 313a, 313b, and 313c, respectively. Such degradation affects the profile of the lower patterned mask 313. The top surface of a corner prior to etching may have a dimension of about 2 nm to about 5 nm; however, such exposed corners may be degraded due to etching as shown in FIG. 3.

Figure 4:
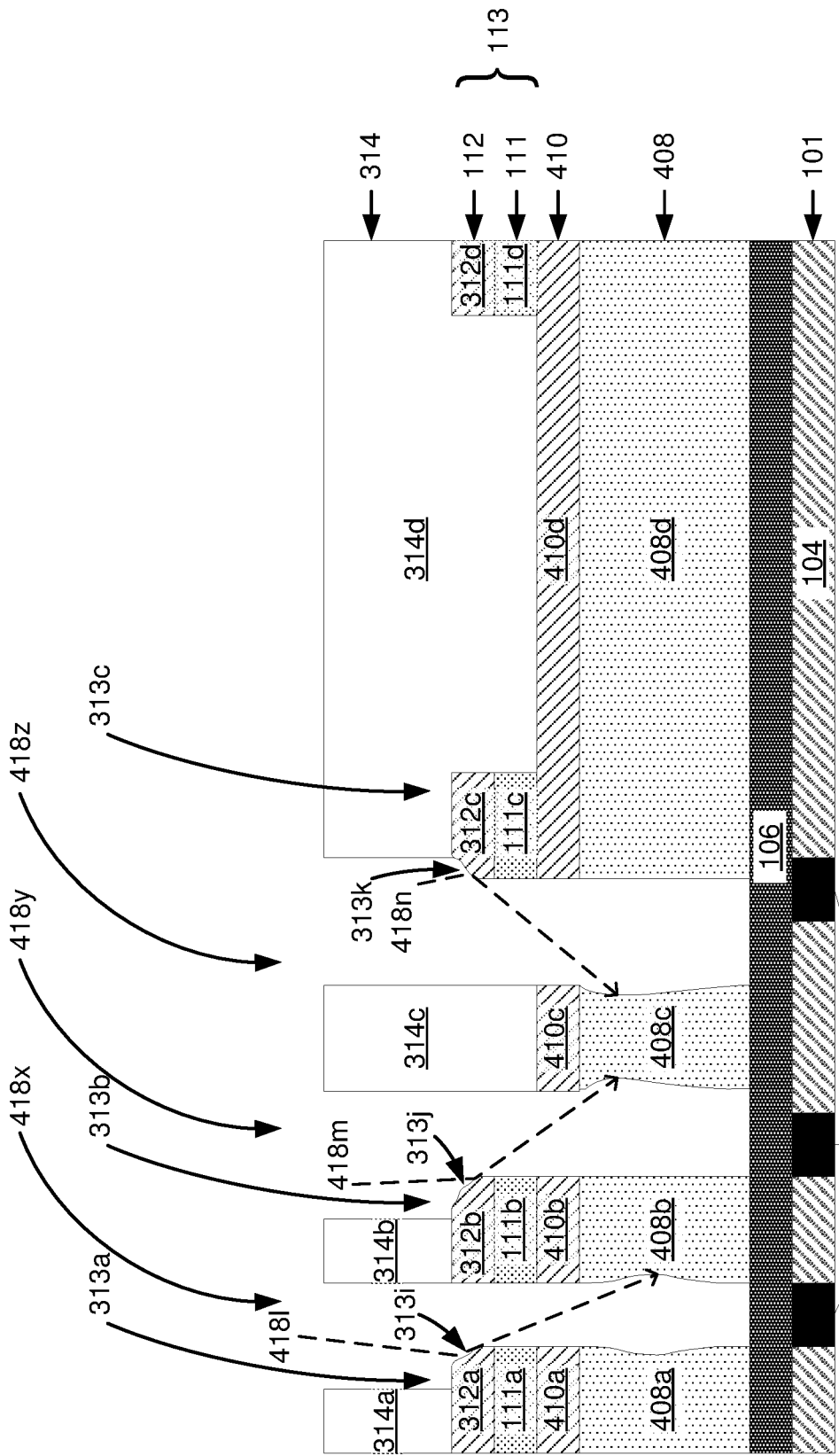

In FIG. 4, the ultra-low k dielectric layer 108 is etched using the lower patterned mask 314a, 314b, 314c and 314d as a mask to thereby form vias 418x, 418y, and 418z. During this operation, a fluorocarbon gas may be introduced with a second gas which may include one or more of oxygen, nitrogen, and argon.

Etching species flow into vias 318x, 318y, and 318z of FIG. 3, etching through second etch stop layer 110 to form patterned etch stop layer 410, which includes first patterned etch stop material 410a, second patterned etch stop material 410b, third patterned etch stop material 410c, and fourth patterned etch stop material 410d. During etch, etching species flow into vias 318x, 318y, and 318z of FIG. 3, but the species then hit the uneven profile of the degraded corners 313i, 313j, and 313k at an angle, such that the trajectory causes etching species to undercut sidewalls of patterned ultra-low k dielectric layer 408. Undercut refers to a sidewall of a feature being curved, or may refer to features where negative features have nonuniform etching on the sidewalls, where the critical dimension of the feature throughout the depth of the feature varies by ±2 to 4 nm.

For example, first trajectory 418l shows an example of a path that an etching species may take when etching species hits first degraded corner 313i and sidewall of second patterned ultra-low k dielectric material 408b. Another example second trajectory 418m shows an example path of an etching species such that the etching species hits second degraded corner 313j, thereby etching sidewall of third patterned ultra-low k dielectric material 408c. Third trajectory 418n is yet another example path of an etching species such that the etching species hits third degraded corner 313k, thereby etching the other sidewall of third patterned ultra-low k dielectric material 408c. In some cases, trajectories such as those described herein may also affect other sidewalls of the patterned ultra-low k dielectric layer 408, such as on sidewalls of the first patterned ultra-low k dielectric material 408a and fourth patterned ultra-low k dielectric material 408d. During etching, the upper patterned mask 118 may degrade and reduce in thickness to leave etched upper patterned mask 418.

Figure 5:
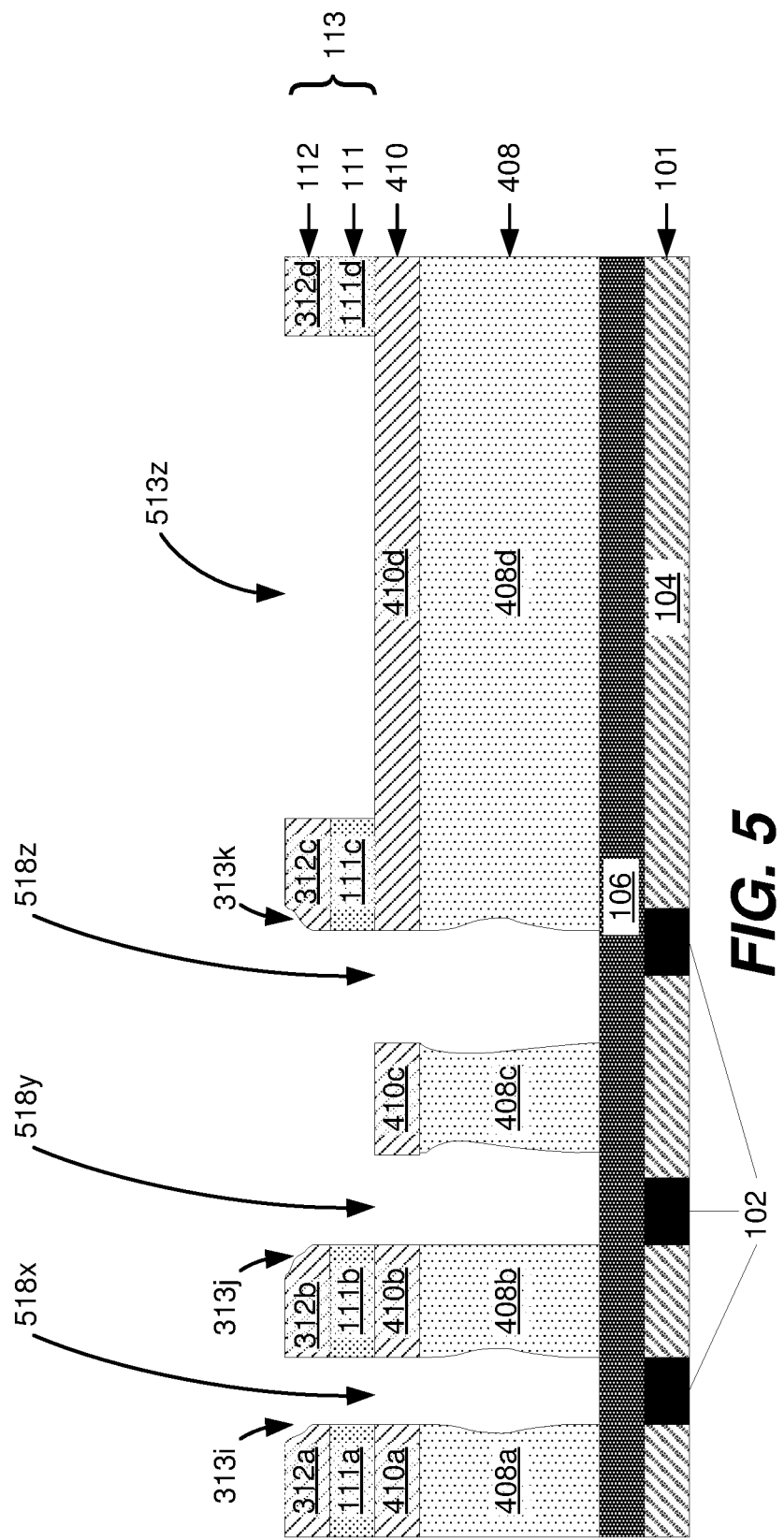

In FIG. 5, stripping the patterned spin-on carbon layer 314 leaves vias 518x, 518y, and 518z, which penetrate down to the patterned ultra-low k dielectric material 408. However, vias 518x, 518y, and 518z have a degraded profile due to the undercut caused by prior etching and during stripping of the patterned spin-on carbon layer 314, plasma used to etch the spin-on carbon will cause further degradation. However, due to the degradation and undercut, the resulting via has an undesirable profile. Removal of the patterned spin-on carbon layer 314 also leaves trench 513z.

Figure 6:
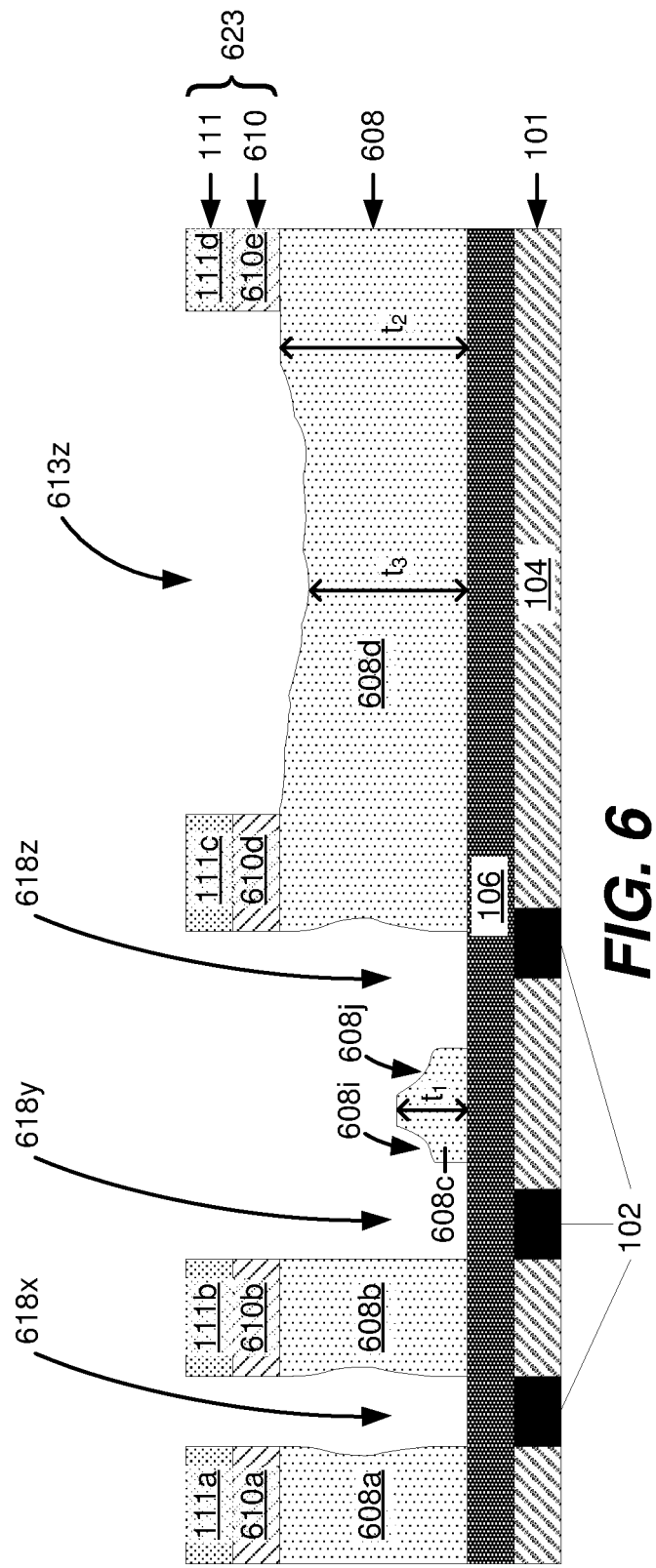

In FIG. 6, TEOS material is etched from the substrate. During this operation, first TEOS material 312a and second TEOS material 312b are selectively removed from the substrate, leaving exposed first titanium hard mask 111a with underlying first patterned second etch stop material 610a and second titanium nitride hard mask 111b with underlying second patterned second etch stop material 610b, respectively. In this example, second etch stop layer 610 material is the same TEOS material as TEOS layer 312; as a result, third patterned etch stop layer 410c is removed from the surface of third patterned ultra-low k dielectric material 408c. Third TEOS material 312c and fourth TEOS material 312d are also selectively removed, leaving third titanium nitride hard mask 111c and fourth titanium nitride hard mask 111d, respectively. Since fourth etch stop material 410d is exposed during etch, fourth etch stop material 410d is etched using the third titanium nitride hard mask 111c and fourth titanium nitride hard mask 111d as a mask, leaving third patterned second etch stop material 610d underlying third titanium nitride hard mask 111c and fourth patterned second etch stop material 610e underlying fourth titanium nitride hard mask 111d.

In various embodiments, patterning of this structure further includes etching third patterned ultra-low k dielectric material 408c and fourth patterned ultra-low k dielectric material 408d; although the width of these two regions is different, in some cases etching is desired such that both regions are etched to leave the same thickness of material on the substrate; likewise, the same thickness is etched from the tops of third patterned ultra-low k dielectric material 408c and fourth patterned ultra-low k dielectric material 408d. However, due to pattern loading effects, chemistry used to etch the material during this operation etches the smaller width, third patterned ultra-low k dielectric material 408c faster than fourth patterned ultra-low k dielectric material 408d, resulting in different remaining thicknesses of the degraded third patterned ultra-low k dielectric material 608c and degraded fourth patterned ultra-low k dielectric material 608d.

To etch the fourth patterned ultra-low k dielectric material 408d to sufficient thickness, exposure is prolonged, resulting in degraded third patterned ultra-low k dielectric material 608c having degraded corners 608i and 608j, with a thickness $t_1$ that is much smaller than remaining thickness $t_3$ of degraded fourth patterned ultra-low k dielectric material 608d. For example, the difference between $t_1$ and $t_3$ may be about 5 nm. For example, $t_1$ may be about 10 nm while $t_3$ may be about 15 nm. Further, etching of fourth patterned ultra-low k dielectric material 408d results in a degraded fourth patterned ultra-low k dielectric material 608d having uneven thickness on the surface between the third titanium nitride hard mask 111c and fourth titanium nitride hard mask 111d such that the smallest thickness remaining of degraded fourth patterned ultra-low k dielectric material 608d is $t_3$ and the thickest thickness remaining of degraded fourth patterned ultra-low k dielectric material 608d is Li where the difference between $t_3$ and Li may range from 3 nm to 15 nm. During etch, first patterned ultra-low k dielectric material 608a and second patterned ultra-low k dielectric material 608b are not affected as they are protected by mask 623. The degraded profiles formed in FIG. 6 are a result of RIE lag and pattern loading issues. Etching results in vias 618x, 618y, and 618z and trench 613z and the patterned ultra-low k dielectric layer 608.

The patterning scheme provided in FIGS. 1-6 result in features having degraded or tapered profiles, which may not be desirable in some embodiments.

Provided herein are methods for protecting a future location of a via and a field region during reactive ion etch (RIE) or similar patterning schemes by forming a polymerization protective liner in situ after forming the lower mask and prior to forming the upper mask. In many embodiments, such patterning schemes involve two mask layers at different levels—an upper and a lower level—to achieve the desired pattern. Disclosed embodiments reduce the RIE lag while maintaining critical dimension control for a via ultimately etched to align with underlying metal contacts.

Certain disclosed embodiments involve depositing a polymerization deposited layer after opening a hard mask in a lower mask layer. The polymerization deposited layer acts both as a protection layer for protecting the field region during etching of the ultra-low k dielectric layer to reduce RIE lag, but also for preserving corners and sidewall integrity during patterning of the via. Additionally, the polymerization deposited layer can be deposited to a thin thickness sufficient to protect the corners, sidewalls, and field regions as appropriate without sacrificing critical dimension of the via, and can also be a sacrificial layer that is ultimately removed.

Figure 7:
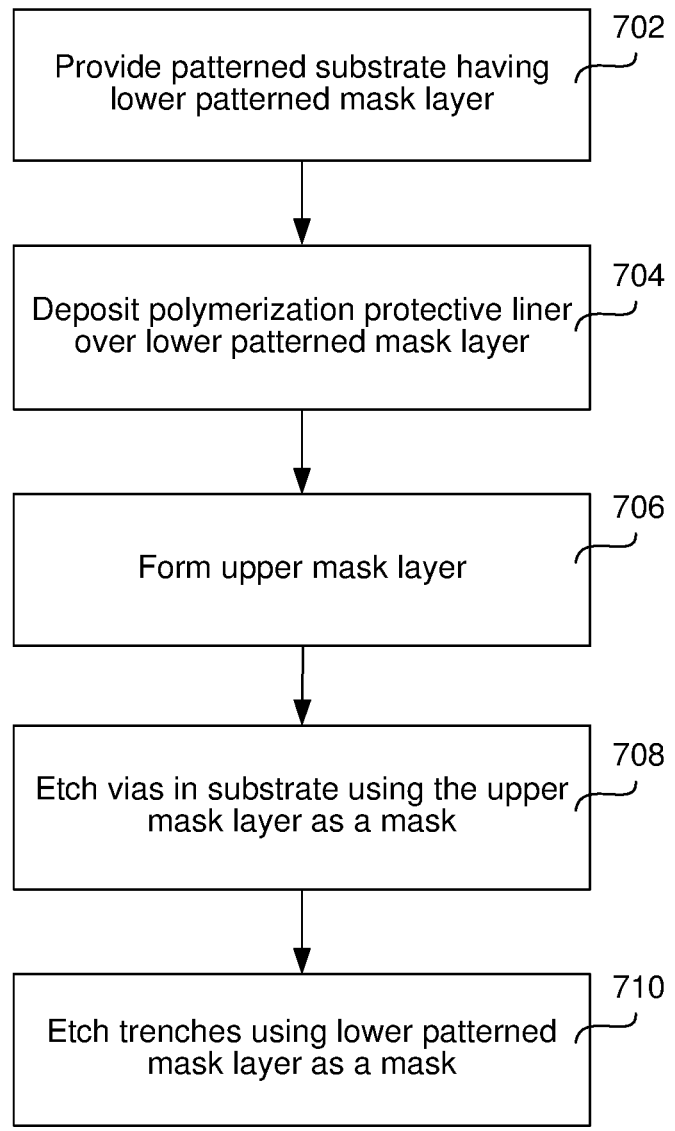
FIG. 7 is a process flow diagram depicting operations for an example method performed in accordance with certain disclosed embodiments.

FIG. 7 is a process flow diagram depicting operations that may be performed in accordance with certain disclosed embodiments. In operation 702, a patterned substrate having a lower patterned mask layer is provided.

The patterned substrate includes a lower patterned mask layer. The mask layer may be a dielectric layer in some embodiments. For example, in some embodiments, the lower patterned mask layer is a silicon-containing layer, such as silicon oxide. In some embodiments, the lower patterned mask layer is a layer deposited using TEOS. The term "lower" in this context refers to a position relative to another mask layer later described below with respect to operation 706. An example of a substrate that may be provided in operation 702 is described above with respect to FIG. 1.

In operation 704, a polymerization protective liner is deposited over the lower patterned mask layer.

Figure 8:
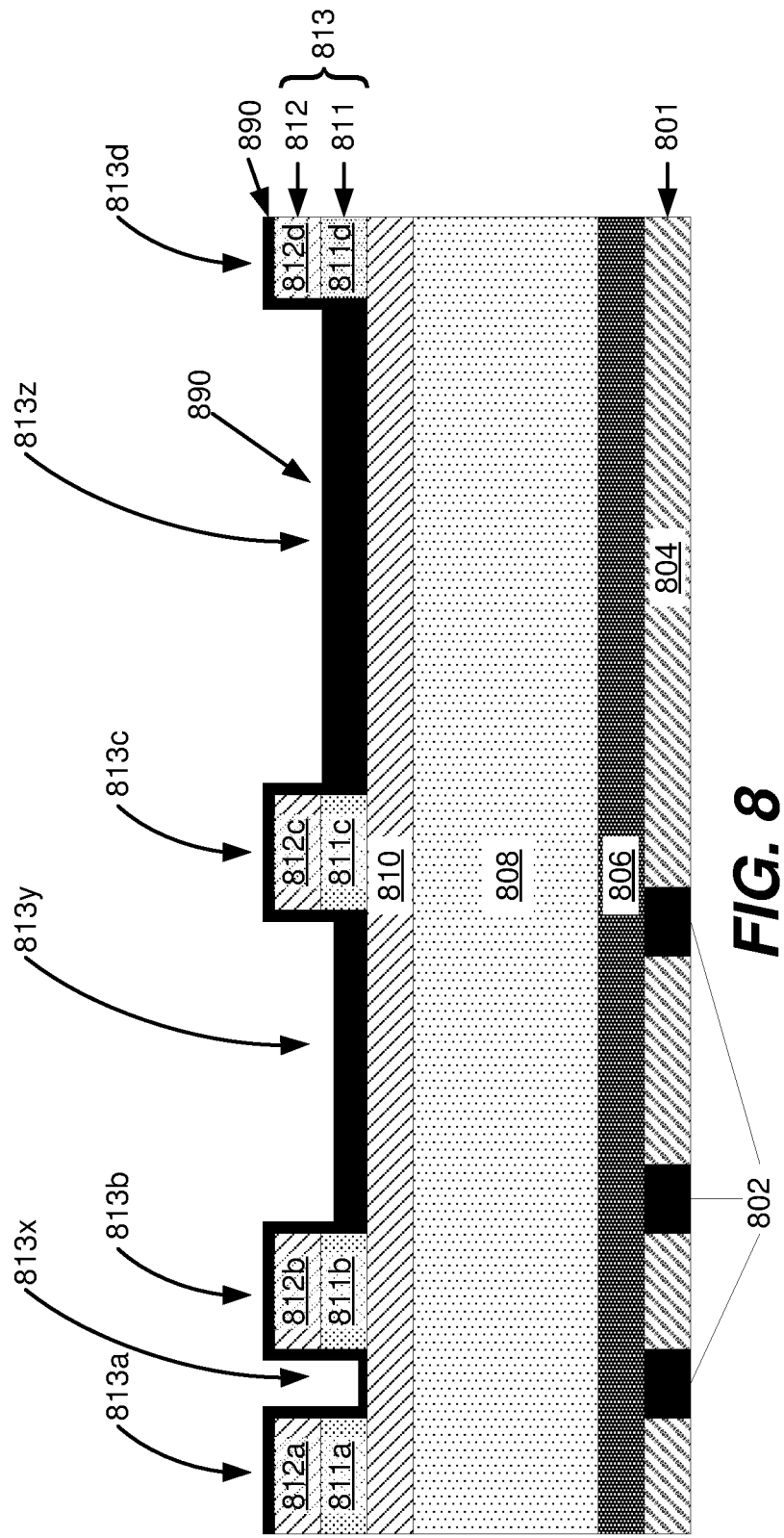
FIGS. 8-13 are schematic illustrations of example drawings of substrates in a patterning scheme in accordance with certain disclosed embodiments.

FIG. 8 shows a substrate having a polymerization protective liner 890 deposited over the substrate shown in FIG. 1. That is, polymerization protective liner 890 is deposited over exposed surfaces that include top surfaces and sidewalls of the lower patterned mask 813, which includes TEOS layer 812 and titanium nitride hard mask 811 over second etch stop layer 810. Each lower mask positive feature 813a, 813b, 813c, and 813d in the lower patterned mask 813 is a stack of two materials—the TEOS material 812a, 812b, 812c, 812d, respectively, and titanium nitride material 811a, 811b, 811c, 811d, respectively. The polymerization protective liner 890 also deposits over exposed surfaces of the second etch stop layer 810. Between lower mask positive features 813a, 813b, 813c, and 813d are lower mask negative features 813x, 813y, and 813z. Underlying second etch stop layer 810 is ultra-low k dielectric layer 808, which may be the same as ultra-low k dielectric layer 108 described above with respect to FIG. 1. Underlying the ultra-low k dielectric layer 808 is first etch stop layer 806, which may be the same as first etch stop layer 106 of FIG. 1. Underlying the first etch stop layer 806 is a first layer 801 including metal contacts 802 and dielectric material 804 which may be the same as first layer 101 having metal contacts 102 and dielectric material 104, respectively, as discussed above with respect to FIG. 1.

Polymerization protective liner 890 may be formed by implementing silicon tetrachloride and methane polymer deposition. In various embodiments, the polymerization protective liner is deposited in situ; that is, in some embodiments the polymerization protective liner is deposited in the same chamber as the etch chamber used during etching operations. While such material may be used in front end of line processes for gate control and critical dimension increase, such material may be suitable in back end of line processing over a titanium nitride hard mask. Extra polymerization at the end of titanium nitride hard mask open operations can be used to add an extra layer. Deposition may not necessarily be uniform as the thickness of the amount polymerized on the field regions may be greater than the material deposited between titanium nitride lines; however, such deposition can still preserve corners and reduce RIE lag as desired, by tailoring the amount of deposition and toggling process conditions. In various embodiments, the polymerization protective liner 890 is nonconformal, having thicker deposition in larger features and thinner deposition in smaller features.

Polymerization protective liner 890 may be a polymerizing layer of silicon oxide material. In some embodiments, polymerization protective liner 890 is an oxide having a structure different from that of TEOS layer 812 or second etch stop layer 810. In some embodiments, polymerization protective liner 890 may be a low quality silicon oxide having chlorine impurities and/or other impurities. In various embodiments, the polymerization protective liner 890 is less dense than the TEOS layer 812. In some embodiments, the polymerization protective liner 890 is less dense than the second etch stop layer 810. In some embodiments, the polymerization protective liner 890 is less dense than both the TEOS layer 812 and the second etch stop layer 810. In various embodiments, the thickness of the polymerization protective liner 890 is between about 1 nm and about 4 nm. In some embodiments, the polymerization protective liner 890 is deposited and not subsequently annealed, thereby resulting in a lower quality silicon oxide film. In contrast, TEOS layer 812 may be deposited using TEOS followed by annealing at a temperature between about 300° C. and about 400° C. to densify the film.

Polymerization protective liner 890 may not be deposited conformally in various embodiments. For example, in some embodiments, more polymerization may occur in large features of the lower patterned mask 813 such that the thickness of films deposited on the surface of the second etch stop layer 810 is thicker in some regions than the film being deposited on the exposed surface of the second etch stop layer 810 in other regions. In some embodiment, deposition of aspect ratio-dependent.

Polymerization protective liner 890 may be deposited to a thickness between about 3 and about 7 nm in features having a large feature opening between about 50 and about 500 nm. Polymerization protective liner 890 may be deposited to a thickness between about 1 and about 3 nm in features having a small feature opening between about 10 and about 40 nm.

In some embodiments, conformality of the film being deposited can be modulated by varying the pressure of the chamber, during deposition. In some embodiments, a low pressure may be between about 1 mTorr and about 100 mTorr, or less than about 8 mTorr, or between about 5 mTorr and about 80 mTorr.

In various embodiments, polymerization protective liner 890 may be deposited by polymerization involving exposing the substrate to a vapor phase polymerization deposition precursor. The polymerization protective liner 890 may be deposited using a silicon-containing or a carbon-containing precursor. One example silicon-containing precursor is a silicon chloride ($SiCl_4$) precursor. One example carbon-containing precursor is methane ($CH_4$). The conformality of the film being deposited can be modulated by varying the gas ratio between silicon-containing and carbon-containing gases. Polymerization may be performed in a reactive ion etch chamber used for subsequent or prior etching operations.

In alternative embodiments, the polymerization protective liner 890 is deposited using a deposition process such as atomic layer deposition (ALD) and/or plasma-enhanced atomic layer deposition (PEALD). In some embodiments, polymerization protective liner 890 is deposited using chemical vapor deposition (CVD) and/or plasma-enhanced chemical vapor deposition (PECVD). Plasma may be used in some embodiments. In some embodiments where plasma is used to deposit the polymerization protective liner 890, a lower power may be used to modulate conformality of films. For example, in some embodiments, a plasma may be generated using a power of less than about 300 W, or less than about 250 W, for a single wafer.

In some embodiments, a bias may be applied to the substrate during deposition. For example, in some embodiments, a bias voltage of about 140V may be applied to the substrate during deposition.

Polymerization protective liner 890 may be difficult to deposit in narrow gaps such that other materials may be inadvertently etched during polymerization. For example, ultra-low k dielectric material or titanium nitride material may be susceptible to etching during this deposition process. As a result, particular chemistries may be selected to deposit the polymerization protective liner 890. For example, some examples include halogen such as silicon tetrachloride ($SiCl_4$) (having a flow rate of about 5 to about 40 sccm), chlorine ($Cl_2$) (having a flow rate of about 5 to about 50 sccm), hydrogen bromide (HBr) (having a flow rate of about 30 to about 300 sccm), with dilution gases such as oxygen (O), nitrogen ($N_2$), argon (Ar), and helium (He). In various embodiments, a halogen-containing deposition chemistry is used to deposit the polymerization protective liner 890.

The polymerization protective liner 890 may be modulated such that deposition is only on regions to be protected. For example, in an embodiment where it is desired to preserve corners such as further described below, the polymerization protective liner 890 can be used to polymerize at corners such as corners having a size of about 5 nm to about 7 nm. Such deposition may, for example, be deposited on titanium nitride or silicon oxide material. In another embodiment where it is desirable to reduce RIE lag, the polymerization protective liner 890 may be deposited on field regions of a surface without depositing on sidewalls by modulating process conditions including but not limited to temperature, plasma conditions, process gases, and process chamber pressure.

In some embodiments, after the polymerization protective liner 890 is deposited, the substrate may be subject to a short "flash" cleaning involving exposure to an oxygen and argon plasma. For example, this may be particularly useful for cleaning in smaller features while not affecting larger features.

In various embodiments, the polymerization protective liner 890 is deposited nonconformally such that thicker deposition is formed in larger features (such as features having an aspect ratio greater than 1:10 or features having a feature opening greater than 50 nm) and thinner deposition is formed in smaller features (such as features having an aspect ratio smaller than 1:4 or features having a feature opening less than 30 nm). In various embodiments, thicker polymerization is formed at the bottoms of features than on the sidewalls.

Figure 9:
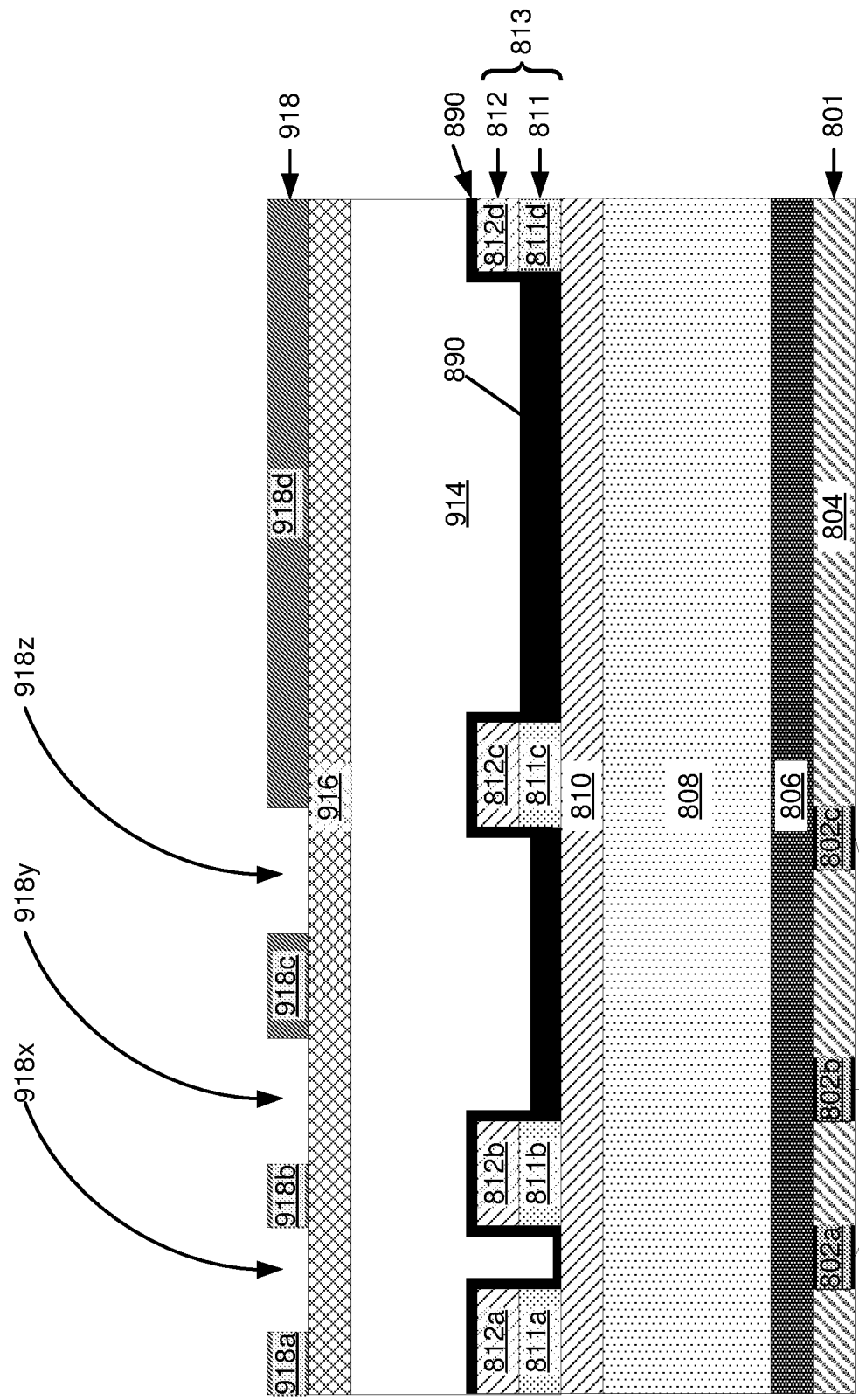

Returning to FIG. 7, in operation 706, an upper mask layer is formed over the polymerization protective liner. Prior to operation 706, a carbon-containing material may be deposited over the polymerization protective liner prior to forming the upper mask. An example substrate having an upper mask formed over a polymerization protective liner is shown in FIG. 9. FIG. 9 depicts a substrate having first layer 801, which includes metal contacts 802 and dielectric material 804. Metal contacts 802 include first metal contact 802a, second metal contact 802b, and third metal contact 802c. Overlying first layer 801 is first etch stop layer 806, and overlying first etch stop layer 806 is ultra-low k dielectric layer 808. On top of ultra-low k dielectric layer 808 is second etch stop layer 810, with lower patterned mask 813 over second etch stop layer 810, where lower patterned mask 813 includes titanium nitride hard mask 811 and TEOS layer 812. Polymerization protective liner 890, as previously deposited over lower patterned mask 813, is depicted in FIG. 9. Additionally, spin-on carbon layer 914 is formed over polymerization protective liner 890, followed by third etch stop layer 916 deposition. Upper patterned mask 918 is formed and patterned (or lithographically defined) to form an upper pattern. Upper patterned mask 918 includes first upper patterned mask positive feature 918a, second upper patterned mask positive feature 918b, third upper mask positive feature 918c, and fourth upper mask positive feature 918d after patterning. Between first upper patterned mask positive feature 918a and second upper patterned mask positive feature 918b is first upper mask negative feature 918x; between second upper patterned mask positive feature 918b and third upper mask positive feature 918c is second upper patterned mask negative feature 918y; and between third upper mask positive feature 918c and fourth upper mask positive feature 918d is third upper patterned mask negative feature 918z. First upper mask negative feature 918x may align with first metal contact 802a; second upper patterned mask negative feature 918y may align with second metal contact 802b; and third upper patterned mask negative feature 918z may align with third metal contact 802c. First upper patterned mask positive feature 918a may largely overlap with first lower patterned mask positive feature 813a; second upper patterned mask positive feature 918b may overlap with at least some of second lower patterned mask positive feature 813b; third upper mask positive feature 918c may be positioned between second lower patterned mask positive feature 813b and third lower patterned mask positive feature 813c; and fourth upper mask positive feature 918d may overlap with at least some of third lower patterned mask positive feature 813c and fourth lower patterned mask positive feature 813d. Forming of upper mask layer in operation 706 may involve depositing spin-on carbon layer 914; depositing third etch stop layer 916; depositing upper patterned mask 918; and patterning upper patterned mask 918.

In some embodiments, after depositing the polymerization protective liner, an optional plasma flash operation may be performed to remove some unevenly deposited regions and smoothen them. A plasma flash operation may involve introducing carbon tetrafluoride and generating a plasma using a low pulsed bias, pulsed between 0V and 50V using plasma generated using a power between about 150 W and about 250 W at 130V.

Returning to FIG. 7, in operation 708, vias are etched in the substrate using the upper mask layer as a mask. Vias may be etched to a critical dimension between about 10 nm and about 30 nm or between about 20 nm and about 30 nm.

Figure 10:
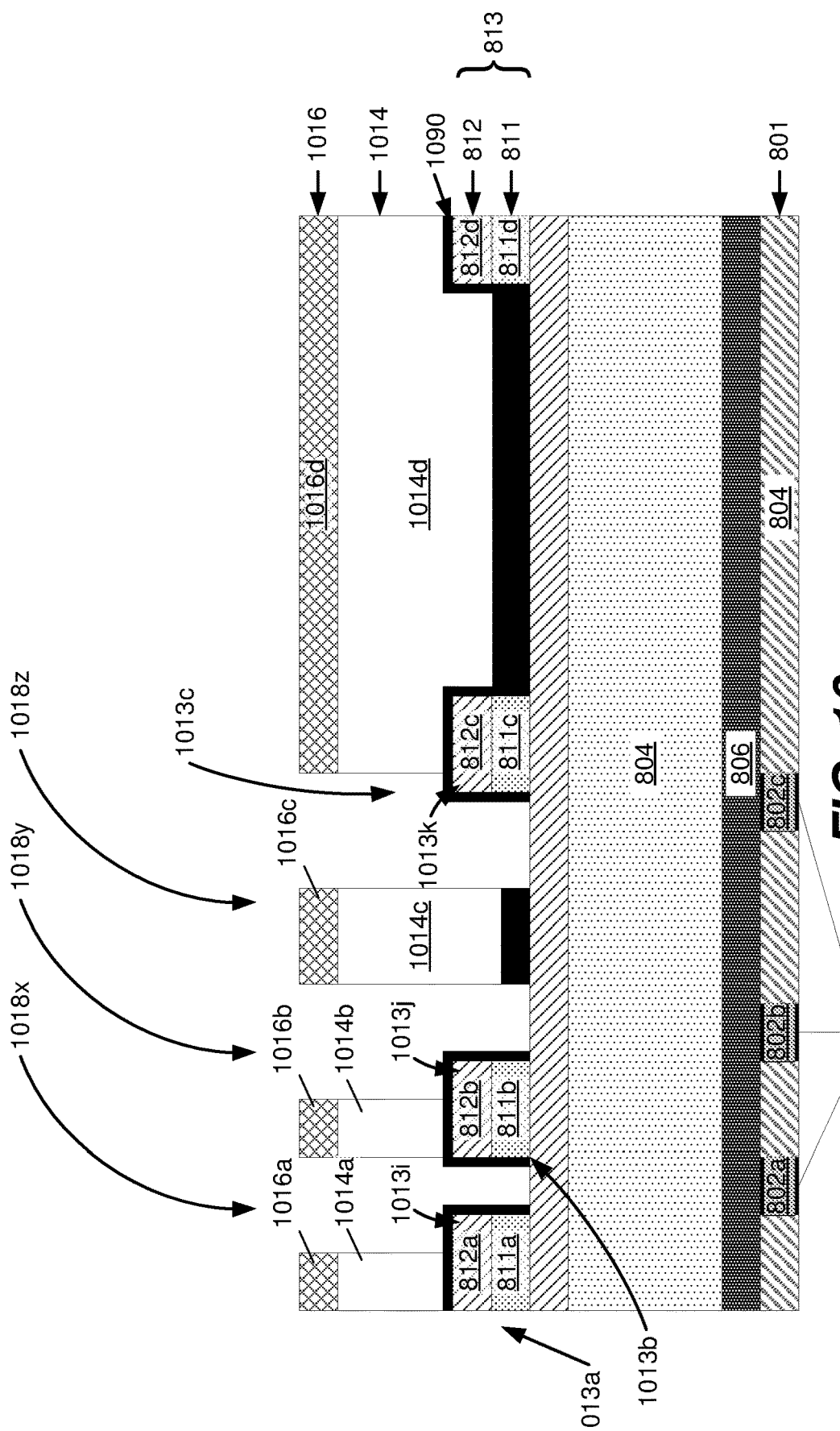

An example is provided in FIG. 10. FIG. 10 shows a substrate from FIG. 9 whereby first via 1018x, second via 1018y, third via 1018z are formed by etching vertically through third etch stop layer 916 and spin-on carbon layer 914 using upper patterned mask 918 ultra-low k dielectric layer 808 as a mask having first upper patterned mask positive feature 918a, second upper patterned mask positive feature 918b, third upper patterned mask positive feature 918c, and fourth upper patterned mask positive feature 918d. Third etch stop layer 916 is thereby patterned to form patterned third etch stop layer 1016 having first patterned third etch stop material 1016a, second patterned third etch stop material 1016b, third patterned third etch stop material 1016c, and fourth patterned third etch stop material 1016d consistent with upper patterned mask 918 having first upper patterned mask positive feature 918a, second upper patterned mask positive feature 918b, third upper patterned mask positive feature 918c, and fourth upper patterned mask positive feature 918d, respectively. Likewise, spin-on carbon layer 914 is patterned to form first patterned spin-on carbon material 1014a, second patterned spin-on carbon material 1014b, third patterned spin-on carbon material 1014c, and fourth patterned spin-on carbon material 1014d. Due to the presence of polymerization protective liner 1090, first preserved corner 1013i, second preserved corner 1013j, and third preserved corner 1013k are protected; and the underlying first TEOS material 812a, second TEOS material 812b, and third TEOS material 812c, respectively, maintain their profiles such that first lower mask positive feature 1013a, second lower mask positive feature 1013b, and third lower mask positive feature 1013c of lower mask 813 can be effectively used as a mask in subsequent operations.

Operation 708 of FIG. 7 may involve etching using one or more of the following etching gases: carbon monoxide, nitrogen, oxygen, hydrogen, argon, and fluorocarbon such as $CF_4$, $C_4F_8$, $CH_2F_2$, $C_4F_6$ for example, and combinations thereof. Additionally, plasma may be used in some embodiments such that the plasma is generated using a power between about 50 and about 500 W including an optional bias that if applied, may be powered at a bias power of 50V to about 300V.

Vias are etched using the upper patterned mask layer as a mask. An example is provided in FIG. 11, whereby first via 1118x, second via 1118y, and third via 1118z are formed using first lower mask positive feature 1013a, second lower mask positive feature 1013b, and third patterned lower mask positive feature 1013c as a mask. First via 1118x, second via 1118y, and third via 1118z are formed such that second etch stop layer 810 is patterned to form patterned second etch stop layer 1110 having first patterned second etch stop material 1110a, second patterned second etch stop material 1110b, third patterned second etch stop material 1110c, and fourth patterned second etch stop material 1110d;

likewise, ultra-low k dielectric layer 808 is patterned to form patterned ultra-low k dielectric layer 1108, which includes first patterned ultra-low k dielectric material 1108a, second patterned ultra-low k dielectric material 1108b, third patterned ultra-low k dielectric material 1108c, and fourth patterned ultra-low k dielectric material 1108d. First etch stop layer 806 prevents further etching to underlying layers. As a result of polymerization protective liner 1090, no tapered corners exist on the substrate as first preserved corner 1013i, second preserved corner 1013j, and third preserved corner 1013k are protected; accordingly etching species used to form patterned ultra-low k dielectric layer 1108 does not result in undercut in first patterned ultra-low k dielectric material 1108a, second patterned ultra-low k dielectric material 1108b, third patterned ultra-low k dielectric material 1108c, and fourth patterned ultra-low k dielectric material 1108d.

Figure 11:
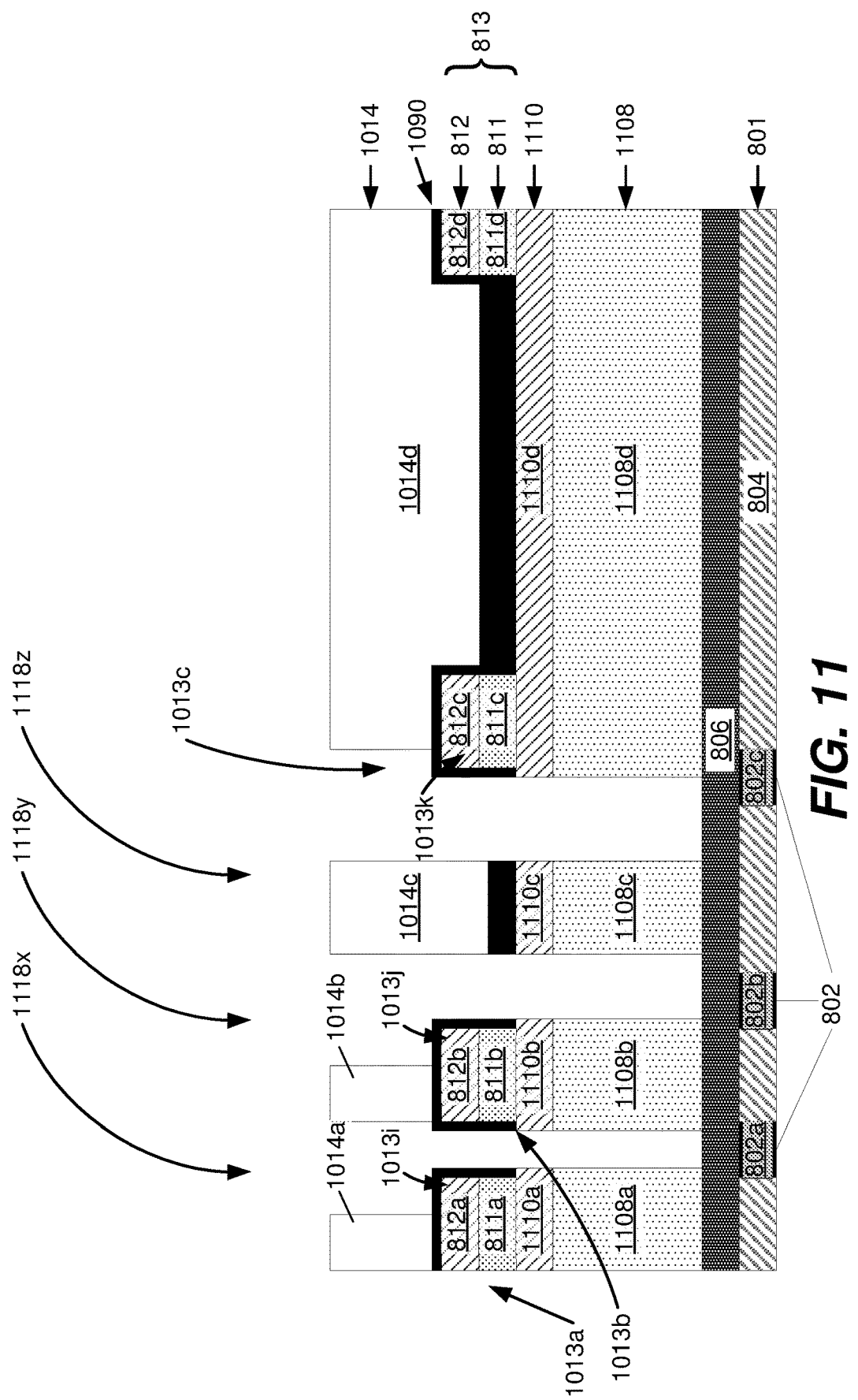
Figure 12:
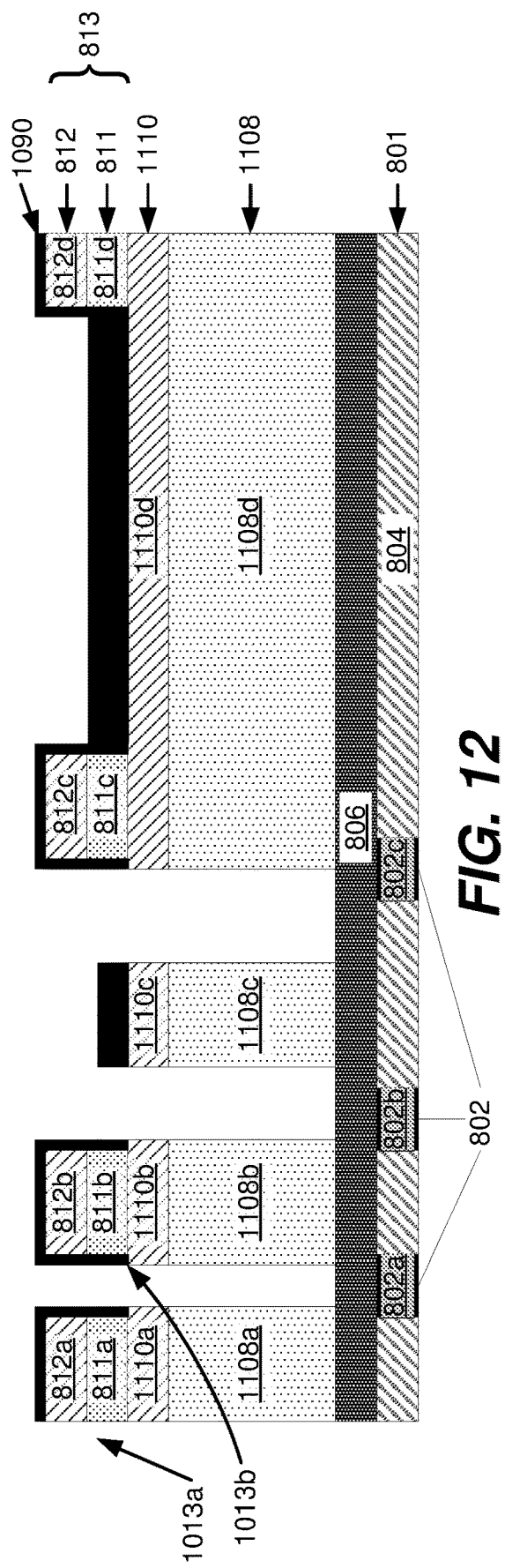
Figure 13:
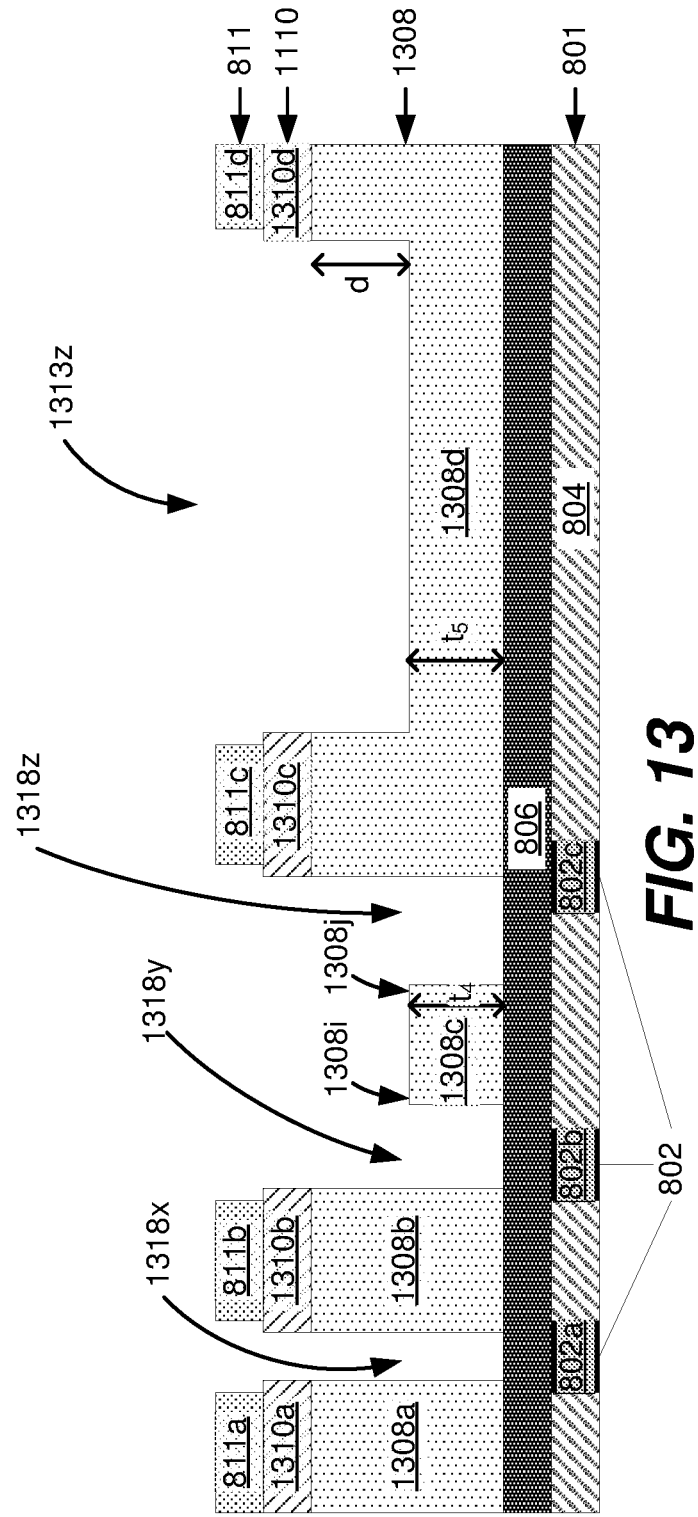

In operation 710, trenches are etched using the lower patterned mask layer as a mask. An example is provided in FIG. 12. As shown, the substrate provided in FIG. 11 is exposed to etching gases to remove patterned spin-on carbon layer 1014, patterned third etch stop layer 1016, and upper patterned mask layer 918. During this operation, polymerization protective liner 1090 is exposed to the trench etches. During this operation, some exposed regions of 1090 are removed but titanium nitride hard mask 811 is used as a hard mask to prevent etching in regions underlying titanium nitride hard mask 811, including first, second, third, and fourth patterned second etch stop material 1310a, 1310b, 1310c, and 1310d, respectively, in the patterned second etch stop layer 1110. First patterned ultra-low k dielectric material 1308a and second patterned ultra-low k dielectric material 1308b are protected by exposed first titanium hard mask 811a with underlying first patterned second etch stop material 1310a and second titanium nitride hard mask 811b with underlying second patterned second etch stop material 1310b, respectively. Third patterned ultra-low k dielectric material 1308c and fourth patterned ultra-low k dielectric material 1308d are etched such that the remaining thicknesses Li and is are within about 3 Å of each other thereby reducing RIE lag. That is, 1108d in FIG. 13 is etched such that an amount d is etched from the surface of 1308d. In some embodiments, d is at least between about 30% and about 60% of the total thickness of patterned ultra-low k dielectric layer 1308. Due to the presence of polymerization protective liner 1090, first preserved corner 1308i and second preserved corner 1308j are provided. Etching results in vias 1318x, 1318y, and 1318z and trench 1313z and the patterned ultra-low k dielectric layer 1308.

Although specific examples are provided herein, it will be understood that a polymerization protective liner can have many applications. Since the liner deposition can be tailored using two knobs such as the $SiCl_4$ ratio over $Cl_2$:HBr and the pressure and/or power conditions to adjust the thickness mostly to achieve various thicknesses over a patterned substrate and can be easily removed during a patterning scheme, the polymerization protective liner described herein can be used to reduce RIE lag, preserve feature profiles and reduce undercut, or both as appropriate and desired.

Apparatus

Disclosed embodiments may be performed in any suitable deposition and/or etching chamber or apparatus, which may be available from Lam Research Corporation of Fremont, CA.

Deposition of a polymerization protective liner as described herein may be performed in any suitable apparatus. In various embodiments, the polymerization protective liner is performed in an etch chamber used for reactive ion etch.

Any suitable etch chamber may be used for etching operations described herein. Further description of plasma etch chambers may be found in U.S. Pat. Nos. 6,841,943 and 8,552,334, which are herein incorporated by reference in their entireties.

Disclosed embodiments are performed in an inductively coupled plasma (ICP) reactor. One example is provided in FIG. 14. Such ICP reactors have also been described in U.S. Pat. No. 9,362,133 issued Jun. 7, 2016, filed Dec. 10, 2013, and titled "METHOD FOR FORMING A MASK BY ETCHING CONFORMAL FILM ON PATTERNED ASHABLE HARDMASK," hereby incorporated by reference for the purpose of describing a suitable ICP reactor for implementation of the techniques described herein. Although ICP reactors are described herein, in some embodiments, it should be understood that capacitively coupled plasma reactors may also be used. An example chamber or apparatus may include a chamber having chamber walls, a chuck for holding a substrate or wafer to be processed which may include electrostatic electrodes for chucking and dechucking a wafer and may be electrically charged using a radio frequency (RF) power supply, an RF power supply configured to supply power to a coil to generate a plasma, and gas flow inlets for inletting gases as described herein. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., etching gas, etc.), bias power, temperature, vacuum settings, and other process conditions. The chamber may also be used to deposit carbon-containing material onto a substrate.

Figure 14:
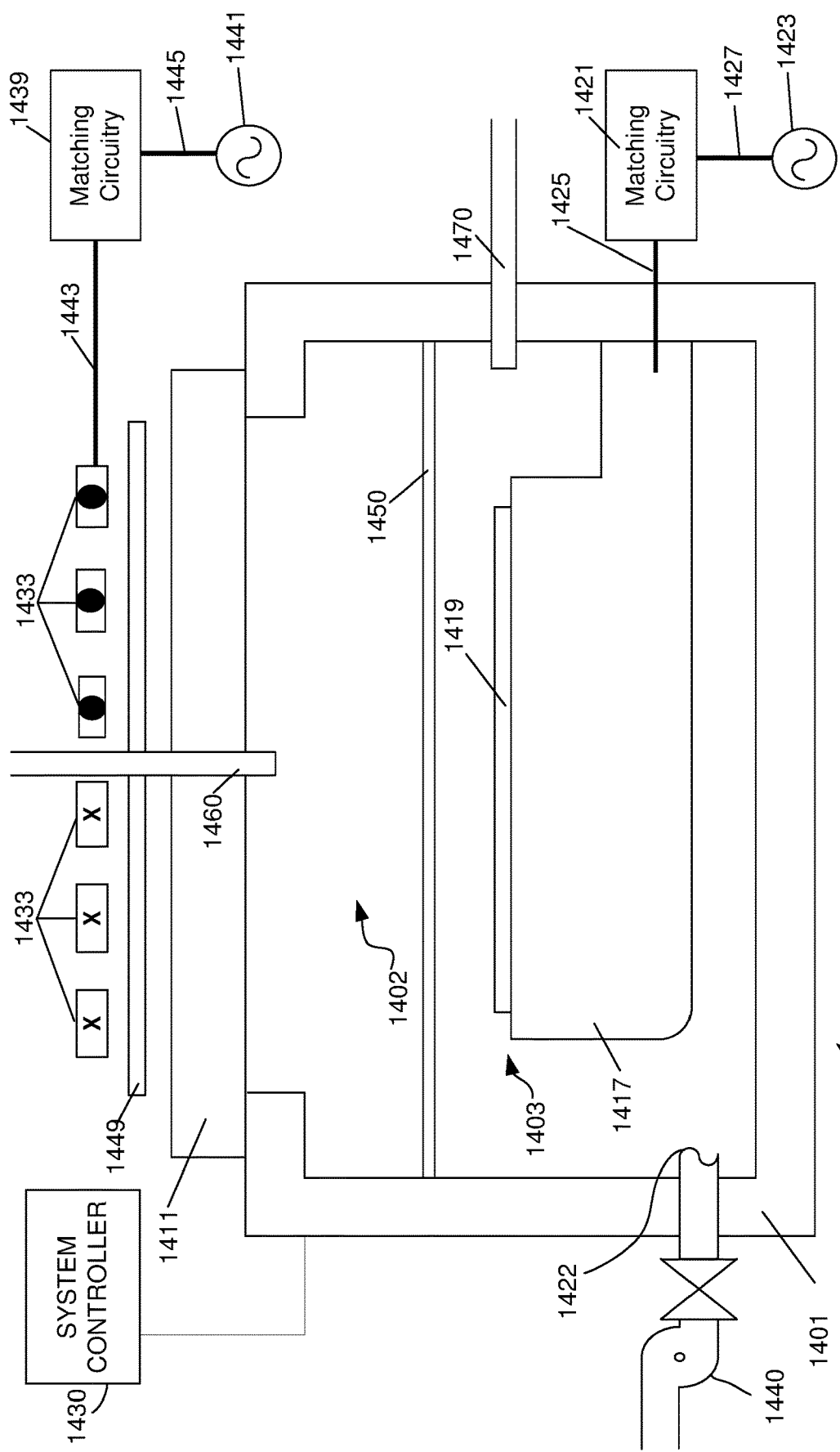
FIG. 14 is a schematic diagram of an example process chamber for performing certain disclosed embodiments.

FIG. 14 schematically shows a cross-sectional view of an inductively coupled plasma integrated etching and deposition apparatus 1400 appropriate for implementing certain embodiments herein, an example of which is an inductively coupled plasma reactor, produced by Lam Research Corp. of Fremont, CA The inductively coupled plasma integrated etching and deposition apparatus 1400 includes a processing chamber 1401 structurally defined by chamber walls and a window 1411. The chamber walls may be fabricated from stainless steel or aluminum. The window 1411 may be fabricated from quartz or other dielectric material. An optional internal showerhead 1450 divides the processing chamber 1401 into an upper sub-chamber 1402 and a lower sub-chamber 1403. The showerhead may include one hole, or may include multiple holes for delivering and distributing gases and/or plasma species to lower sub-chamber 1403. In most embodiments, showerhead 1450 may be removed, thereby utilizing a chamber space made of upper sub-chambers 1402 and 1403. A chuck 1417 is positioned within the lower sub-chamber 1403 near the bottom inner surface. The chuck 1417 is configured to receive and hold a semiconductor wafer 1419 upon which the etching and deposition processes are performed. The chuck 1417 can be an electrostatic chuck for supporting the wafer 1419 when present. In some embodiments, an edge ring (not shown) surrounds chuck 1417, and has an upper surface that is approximately planar with a top surface of a wafer 1419, when present over chuck 1417. The chuck 1417 also includes electrostatic electrodes for chucking and dechucking the wafer. A filter and DC clamp power supply (not shown) may be provided for this purpose. Other control systems for lifting the wafer 1419 off the chuck 1417 can also be provided. The chuck 1417 may be movable along an axis substantially parallel to the sidewalls of the chamber whereby the surface of the chuck 1417 is substantially parallel to the ground. If a showerhead is used, the distance between the wafer 1419 and the showerhead (not shown) may be between about 0.5 inches and about 3.0 inches. The chuck 1417 can be electrically charged using an RF power supply 1423. The RF power supply 1423 is connected to matching circuitry 1421 through a connection 1427. The matching circuitry 1421 is connected to the chuck 1417 through a connection 1425. In this manner, the RF power supply 1423 is connected to the chuck 1417.

Elements for plasma generation include a coil 1433 is positioned above window 1411. In various embodiments, a coil is not used in disclosed embodiments. The coil 1433 is fabricated from an electrically conductive material and includes at least one complete turn. The example of a coil 1433 shown in FIG. 14 includes three turns. The cross-sections of coil 1433 are shown with symbols, and coils having an "X" extend rotationally into the page, while coils having a "0" extend rotationally out of the page. Elements for plasma generation also include an RF power supply 1441 configured to supply RF power to the coil 1433. In general, the RF power supply 1441 is connected to matching circuitry 1439 through a connection 1445. The matching circuitry 1439 is connected to the coil 1433 through a connection 1443. In this manner, the RF power supply 1441 is connected to the coil 1433. An optional Faraday shield 1449 is positioned between the coil 1433 and the window 1411. The Faraday shield 1449 is maintained in a spaced apart relationship relative to the coil 1433. The Faraday shield 1449 is disposed immediately above the window 1411. The coil 1433, the Faraday shield 1449, and the window 1411 are each configured to be substantially parallel to one another. The Faraday shield may prevent metal or other species from depositing on the dielectric window of the processing chamber 1401.

Process gases (e.g. oxygen-containing gases, halogen-containing gases, etc.) may be flowed into the processing chamber 1401 through one or more main gas flow inlets 1460 positioned in the upper chamber 1402 and/or through one or more side gas flow inlets 1470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 1440, may be used to draw process gases out of the processing chamber 1401 and to maintain a pressure within the processing chamber 1401. A valve-controlled conduit may be used to fluidically connect the vacuum pump to the processing chamber 1401 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 1460 and/or 1470. In certain embodiments, process gas may be supplied only through the main gas flow inlet 1460, or only through the side gas flow inlet 1470. In some cases, the gas flow inlets shown in the figure may be replaced more complex gas flow inlets, one or more showerheads, for example. The Faraday shield 1449 and/or optional grid or showerhead 1450 may include internal channels and holes that allow delivery of process gases to the processing chamber 1401. Either or both of Faraday shield 1449 and optional grid 1450 may serve as a showerhead for delivery of process gases. In some embodiments, a liquid vaporization and delivery system may be situated upstream of the processing chamber 1401, such that once a liquid reactant or precursor is vaporized, the vaporized reactant or precursor is introduced into the processing chamber 1401 via a gas flow inlet 1460 and/or 1470.

Radio frequency power is supplied from the RF power supply 1441 to the coil 1433 to cause an RF current to flow through the coil 1433. The RF current flowing through the coil 1433 generates an electromagnetic field about the coil 1433. The electromagnetic field generates an inductive current within the upper sub-chamber 1402. The physical and chemical interactions of various generated ions and radicals with the wafer 1419 selectively etch features of and deposit layers on the wafer.

If the plasma grid is used such that there is both an upper sub-chamber 1402 and a lower sub-chamber 1403, the inductive current acts on the gas or gases present in the upper sub-chamber 1402 to generate an electron-ion plasma in the upper sub-chamber 1402. The optional internal plasma grid 1450 limits the amount of hot electrons in the lower sub-chamber 1403. In some embodiments, the apparatus is designed and operated such that the plasma present in the lower sub-chamber 1403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 1403 through port 1422. The chuck 1417 disclosed herein may operate at elevated temperatures ranging between about 200° C. and about 500° C. The temperature will depend on the process operation and specific recipe.

Processing chamber 1401 may be coupled to facilities (not shown) when installed in a clean room or a fabrication facility. Facilities include plumbing that provide processing gases, vacuum, temperature control, and environmental particle control. These facilities are coupled to processing chamber 1401, when installed in the target fabrication facility. Additionally, processing chamber 1401 may be coupled to a transfer chamber that allows robotics to transfer semiconductor wafers into and out of processing chamber 1401 using typical automation.

In some embodiments, a system controller 1430 (which may include one or more physical or logical controllers) controls some or all of the operations of a processing chamber. The system controller 1430 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

The processing chamber 1401 or apparatus may include a system controller. For example, in some embodiments, a controller 1430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1430, depending on the processing specification and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1430, in some implementations, may be a part of or coupled to a computer that is integrated with, coupled to the system, otherwise networked to the system, or a combination thereof. For example, the controller 1430 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 1430 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 15:
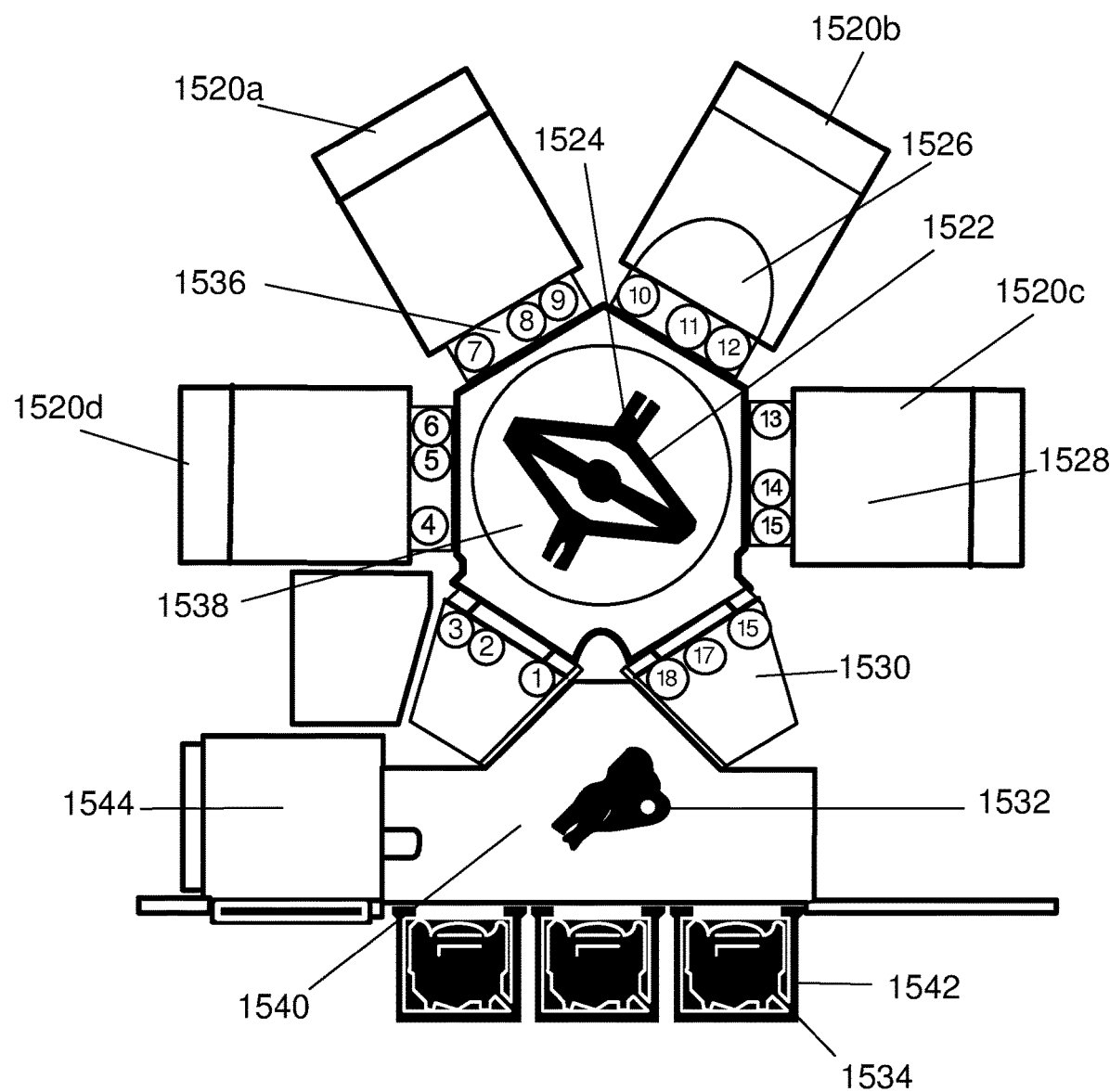
FIG. 15 is a schematic diagram of an example process tool for performing certain disclosed embodiments.

The processing chamber 1401 may be integrated in a multi-station tool such as shown in FIG. 15. Each station may be used to process different operations. For example, one station may be used to perform pre-oxidation while another station is used to perform selective etching of the metal-doped carbon-containing material. Disclosed embodiments may be performed without breaking vacuum and may be performed in the same apparatus.

FIG. 15 depicts a semiconductor process cluster architecture with various modules that interface with a vacuum transfer module (VTM) 1538. The arrangement of transfer modules to "transfer" wafers among multiple storage facilities and processing modules may be referred to as a "cluster tool architecture" system. Airlock module 1530, also known as a loadlock or transfer module, is shown in VTM 1538 with four processing modules 1520a-1520d, which may be individual optimized to perform various fabrication processes. By way of example, processing modules 1520a-1620d may be implemented to perform substrate etching, deposition, ion implantation, wafer cleaning, sputtering, and/or other semiconductor processes. One or more of the substrate etching processing modules (any of 1520a-1620d) may be implemented as disclosed herein, i.e., for performing deposition of the polymerization protective liner, etching to form vias and/or trenches, and other suitable functions in accordance with the disclosed embodiments. Airlock module 1530 and process module 1520 may be referred to as "stations." Each station has a facet 1536 that interfaces the station to VTM 1538. Inside each facet, sensors 1-18 are used to detect the passing of wafer 1526 when moved between respective stations.

Robot 1522 transfers wafer 1526 between stations. In one embodiment, robot 1522 has one arm, and in another embodiment, robot 1522 has two arms, where each arm has an end effector 1524 to pick wafers such as wafer 1526 for transport. Front-end robot 1532, in atmospheric transfer module (ATM) 1540, is used to transfer wafers 1526 from cassette or Front Opening Unified Pod (FOUP) 1534 in Load Port Module (LPM) 1542 to airlock module 1530. Module center 1528 inside process module 1520 is one location for placing wafer 1526. Aligner 1544 in ATM 1540 is used to align wafers.

In an exemplary processing method, a wafer is placed in one of the FOUPs 1534 in the LPM 1542. Front-end robot 1532 transfers the wafer from the FOUP 1534 to an aligner 1544, which allows the wafer 1526 to be properly centered before it is etched or processed. After being aligned, the wafer 1526 is moved by the front-end robot 1532 into an airlock module 1530. Because airlock modules have the ability to match the environment between an ATM and a VTM, the wafer 1526 is able to move between the two pressure environments without being damaged. From the airlock module 1530, the wafer 1526 is moved by robot 1522 through VTM 1538 and into one of the process modules 1520a-1520d. In order to achieve this wafer movement, the robot 1522 uses end effectors 1524 on each of its arms. Once the wafer 1526 has been processed, it is moved by robot 1522 from the process modules 1520a-1620d to an airlock module 1530. From here, the wafer 1526 may be moved by the front-end robot 1532 to one of the FOUPs 1534 or to the aligner 1544.

The computer controlling the wafer movement can be local to the cluster architecture, or can be located external to the cluster architecture in the manufacturing floor, or in a remote location and connected to the cluster architecture via a network. A controller as described above with respect to FIG. 14 may be implemented with the tool in FIG. 15.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a semiconductor substrate to a chamber, the semiconductor substrate having a target layer having a thickness t and a metallization layer underlying the target layer with at least one region comprising metal;
forming a lower patterned mask layer over the target layer by etching a lower mask layer;
forming a polymerization protective liner over the lower patterned mask layer without breaking vacuum;
forming an upper mask layer over the polymerization protective liner; and
patterning the semiconductor substrate using the upper mask layer to form at least one via.

2. The method of claim 1, wherein the lower patterned mask layer is formed by extreme ultraviolet lithography.

3. The method of claim 1, wherein the etching of the lower mask layer and the forming of the polymerization protective liner are performed in the same chamber.

4. The method of claim 1, wherein at least a portion of the polymerization protective liner is removable.

5. The method of claim 4, wherein the forming of the polymerization protective liner and patterning of the lower patterned mask layer are performed in the same chamber.

6. The method of claim 1, wherein the at least one via aligns with the at least one region comprising metal, and the method further comprises,
after patterning the semiconductor substrate using the upper mask layer, patterning the target layer using reactive ion etch.

7. The method of claim 6, wherein the polymerization protective liner is deposited nonconformally and reduces reactive ion etch lag by at least 5-10%.

8. The method of claim 6, wherein thickness of the polymerization protective liner in features of different sizes are etched at the same rate during the reactive ion etch.

9. The method of claim 1, wherein the polymerization protective liner comprises silicon oxide.

10. The method of claim 9, wherein the polymerization protective liner comprises a thickness between 3 and 7 nanometers (nm).

11. The method of claim 9, wherein the polymerization protective liner comprises a thickness between 1 and 3 nanometers (nm).

12. A method comprising:
providing a semiconductor substrate having a lower patterned mask layer over a target layer having a thickness t and a metallization layer underlying the target layer with at least one region comprising metal;
forming a polymerization protective liner over the lower patterned mask layer;
forming an upper mask layer over the polymerization protective liner;
patterning the semiconductor substrate using the upper mask layer to form at least one via aligning with the at least one region comprising metal; and
after patterning the semiconductor substrate using the upper mask layer, patterning the target layer using reactive ion etch.

13. The method of claim 12, wherein forming of the polymerization protective liner and patterning of the semiconductor substrate using either the lower patterned mask layer or the upper mask layer are performed without breaking vacuum.

14. The method of claim 12, wherein the polymerization protective liner is deposited nonconformally and reduces reactive ion etch lag by at least 5-10%.

15. The method of claim 12, wherein thickness of the polymerization protective liner in features of different sizes are etched at the same rate during reactive ion etch.

16. The method of claim 12, wherein the polymerization protective liner comprises silicon oxide.

17. The method of claim 12, wherein the polymerization protective liner is a sacrificial film.

18. The method of claim 17, wherein the forming of the polymerization protective liner and patterning of the lower patterned mask layer are performed in the same chamber.

19. An apparatus for processing a semiconductor substrate, the apparatus comprising:
one or more process chambers, wherein at least one process chamber includes a pedestal for holding the semiconductor substrate;
a plasma generator;
one or more gas inlets into the process chambers and associated flow-control hardware; and
a controller having at least one processor and a memory, wherein the at least one processor and the memory are communicatively connected with one another, the at least one processor is at least operatively connected with the flow-control hardware, and the memory stores computer-executable instructions for controlling the at least one processor to at least control the flow-control hardware by:
  (i) causing a lower mask layer on the semiconductor substrate to be etched to form a patterned lower mask layer;
  (ii) after causing the lower mask layer to be etched, causing introduction of silicon tetrachloride and methane to form a polymerization protective liner over the patterned lower mask layer;
  (iii) causing an upper mask layer to be formed over the polymerization protective liner; and
  (iv) causing formation of at least one via in the semiconductor substrate by patterning the semiconductor substrate using the upper mask layer.

20. The apparatus of claim 19, wherein the polymerization protective liner comprises silicon oxide.

* * * * *